(12) United States Patent
Rohde et al.

(10) Patent No.: US 7,605,670 B2
(45) Date of Patent: Oct. 20, 2009

(54) USER-DEFINABLE LOW COST, LOW NOISE, AND PHASE HIT INSENSITIVE MULTI-OCTAVE-BAND TUNABLE OSCILLATOR

(75) Inventors: Ulrich L. Rohde, Upper Saddle River, NJ (US); Ajay Kumar Poddar, Fairlawn, NJ (US); Klaus Juergen Schoepf, Ringwood, NJ (US); Parimal Patel, Jersey City, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 135 days.

(21) Appl. No.: 11/600,331

(22) Filed: Nov. 15, 2006

(65) Prior Publication Data

US 2007/0109061 A1     May 17, 2007

Related U.S. Application Data

(60) Provisional application No. 60/736,901, filed on Nov. 15, 2005.

(51) Int. Cl.
*H03B 5/18* (2006.01)
*H03B 9/14* (2006.01)

(52) U.S. Cl. ............... 331/107 DP; 331/96; 331/117 D

(58) Field of Classification Search .......... 331/96, 331/107 SL, 117 D, 107 DP
See application file for complete search history.

(56) References Cited

U.S. PATENT DOCUMENTS

| | | | |
|---|---|---|---|
| 2,502,488 A | 4/1950 | Shockley | |
| 2,524,035 A | 10/1950 | Bardeen et al. | |
| 3,373,379 A | 3/1968 | Black | |
| 3,624,550 A | 11/1971 | Vane | |
| 4,310,809 A | 1/1982 | Buck et al. | |
| 4,338,576 A | 7/1982 | Takahashi et al. | |
| 4,435,688 A | 3/1984 | Shinkawa et al. | |
| 4,479,259 A | 10/1984 | Fenk et al. | |
| 4,527,130 A | * 7/1985 | Luetteke | 331/36 C |

(Continued)

FOREIGN PATENT DOCUMENTS

DE     3443446 A     5/1986

(Continued)

OTHER PUBLICATIONS

A. K. Poddar and K. N. Pandey, "Microwave Switch Using MEMS-Technology," 8th IEEE International Symposium, EDMO-2000, pp. 134-139, Nov. 2000, UK.

(Continued)

*Primary Examiner*—Robert Pascal
*Assistant Examiner*—Levi Gannon
(74) *Attorney, Agent, or Firm*—Lerner, David, Littenberg, Krumholz & Mentlik, LLP

(57) ABSTRACT

An aspect of the present invention is a voltage controlled oscillator that provides multi octave band tenability. The oscillator preferably includes one or more multi planar resonators which allow it to be implemented in integrated circuit form. Oscillators implemented in accordance with the aspect of the present invention provide as wide a tuning range as the YIG based resonators but are much more compact and efficient. Therefore, they are amenable to implementation in integrated circuits and suited for adaptation in third and future generation wireless devices.

13 Claims, 21 Drawing Sheets

U.S. PATENT DOCUMENTS

| | | | |
|---|---|---|---|
| 4,590,443 A | 5/1986 | Ishigaki et al. | |
| 4,619,001 A | 10/1986 | Kane | |
| 4,621,241 A | 11/1986 | Kiser | |
| 4,633,197 A | 12/1986 | Vanderspool, II | |
| 4,661,785 A | 4/1987 | Benjaminson | |
| 4,677,396 A | 6/1987 | Cruz et al. | |
| 4,692,714 A | 9/1987 | Galani | |
| 4,812,784 A | 3/1989 | Chung et al. | |
| 4,868,526 A | 9/1989 | Camiade | |
| 5,041,799 A | 8/1991 | Pirez | |
| 5,053,649 A | 10/1991 | Johnson | |
| 5,142,255 A | 8/1992 | Chang et al. | |
| 5,187,451 A | 2/1993 | Nakamoto et al. | |
| 5,223,801 A | 6/1993 | Bergman | |
| 5,231,361 A | 7/1993 | Smith et al. | |
| 5,363,067 A | 11/1994 | Crandall et al. | |
| 5,373,264 A | 12/1994 | Higgins | |
| 5,402,087 A | 3/1995 | Gorczak | |
| 5,434,542 A | 7/1995 | Veith et al. | |
| 5,650,754 A | 7/1997 | Joshi | |
| 5,661,439 A | 8/1997 | Watkins et al. | |
| 5,748,051 A | 5/1998 | Lewis | |
| 5,821,410 A | 10/1998 | Xiang et al. | |
| 5,854,578 A | 12/1998 | Minasi et al. | |
| 5,856,763 A | 1/1999 | Reeser et al. | |
| 5,900,788 A | 5/1999 | Hagemeyer et al. | |
| 5,936,480 A | 8/1999 | Chong et al. | |
| 6,091,309 A | 7/2000 | Burke et al. | |
| 6,124,767 A | 9/2000 | Woods | |
| 6,172,577 B1 | 1/2001 | Oe et al. | |
| 6,242,843 B1 | 6/2001 | Pohjonen et al. | |
| 6,294,964 B1 | 9/2001 | Satoh et al. | |
| 6,297,708 B1 | 10/2001 | Lemay | |
| 6,326,854 B1 | 12/2001 | Nicholls et al. | |
| 6,392,452 B2 | 5/2002 | Lee et al. | |
| 6,486,744 B1 | 11/2002 | Cann et al. | |
| 6,489,853 B1 | 12/2002 | Lewis | |
| 6,501,341 B2 | 12/2002 | Mashimo et al. | |
| 6,624,726 B2 | 9/2003 | Niu | |
| 6,630,869 B2 | 10/2003 | Flynn et al. | |
| 6,714,088 B2 | 3/2004 | Chang | |
| 6,714,772 B2 | 3/2004 | Kasahara et al. | |
| 6,731,181 B2 | 5/2004 | Fukayama et al. | |
| 6,734,745 B2 | 5/2004 | Sakai | |
| 6,737,928 B2 | 5/2004 | Kubo et al. | |
| 6,825,734 B2 | 11/2004 | Clark | |
| 7,061,333 B2 | 6/2006 | Aikawa et al. | |
| 7,088,189 B2 * | 8/2006 | Rohde et al. | 331/56 |
| 7,102,453 B1 | 9/2006 | Rohde et al. | |
| 7,180,381 B2 * | 2/2007 | Rohde et al. | 331/96 |
| 7,262,670 B2 * | 8/2007 | Rohde et al. | 331/117 R |
| 7,292,113 B2 * | 11/2007 | Rohde et al. | 331/117 R |
| 2001/0004225 A1 | 6/2001 | Nicholls et al. | |
| 2001/0030583 A1 | 10/2001 | Ikarashi | |
| 2001/0035794 A1 | 11/2001 | Fujidai et al. | |
| 2002/0084860 A1 | 7/2002 | Festag et al. | |
| 2003/0160660 A1 | 8/2003 | Chang et al. | |
| 2004/0095197 A1 | 5/2004 | Wang et al. | |
| 2004/0113707 A1 | 6/2004 | Fredriksson | |
| 2004/0130402 A1 | 7/2004 | Marquardt | |
| 2004/0222858 A1 | 11/2004 | Corse et al. | |
| 2004/0227578 A1 * | 11/2004 | Hamalainen | 331/107 A |
| 2005/0156683 A1 | 7/2005 | Rohde et al. | |
| 2005/0242896 A1 | 11/2005 | Rohde et al. | |
| 2005/0280478 A1 | 12/2005 | Patel et al. | |

FOREIGN PATENT DOCUMENTS

| | | |
|---|---|---|
| EP | 0 475 262 A | 3/1992 |
| EP | 0 800 224 A | 10/1997 |
| EP | 0 823 777 | 2/1998 |
| EP | 0 843 374 A | 5/1998 |
| EP | 1 093 216 A | 4/2001 |
| EP | 1 542 353 | 6/2005 |
| JP | 59-072205 A | 4/1984 |
| JP | 59-139708 A | 8/1984 |
| WO | WO-02/05416 A1 | 1/2002 |
| WO | WO-02/17476 A | 2/2002 |
| WO | WO-2005/015731 | 2/2005 |

OTHER PUBLICATIONS

A K. Poddar, S.K. Koul, and B. Bhat, "Millimeter Wave Evanescent Mode Gunn Diode Oscillator in Suspended Stripline Configuration." 22nd international Conference on Millimeter Waves, pp. 265-266, Jul. 1997.

A. M. Elsayed and M. I. Elmasry," Low-Phase-Noise LC Quadrature VCO Using Coupled Tank Resonators in a Ring Structure," IEEE, JSSC, vol. 36, pp. 701-705, Apr. 2001.

A. Ward and B. Ward, "A Comparison of Various Bipolar Transistor Biasing Circuits," Applied Microwave & Wireless, vol. 13, pp. 30-52, 2001.

A.K. Poddar, A Novel Approach for Designing Integrated Ultra Low Noise Microwave Wideband Voltage-Controlled Oscillators, Dec. 14, 2004.

A.V. Grebennikov, "Microwave Transistor Oscillators: an Analytic Approach to Simplify Computer-Aided Design", Microwave Journal, pp. 292-300, May 1999.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Andrew V. Grebennikov, "Microwave FET Oscillators: an Analytic Approach to Simplify Computer-Aided Design", Microwave Journal, pp. 100-110, Jan. 2000.

B. Van der Pol, "The Nonlinear Theory of Electrical Oscillations," Proc. IRE, vol. 22, No. 9, pp. 1051-1086, Sep. 1934.

Byeong-Ha Park, "A Low-Voltage, Low-Power, CMOS 900 MHz Frequency Synthesizer," Ph.D. Dissertation, Georgia Institute of Technology, Dec. 1997.

C. Arnaud, D. Barataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions on MTT, vol. 48, No. 12, pp. 2625-2629, Dec. 2000.

D. B. Leeson, A Simple Model of Feedback Oscillator Noise Spectrum, Proc. IEEE, pp. 329-332, 1966.

D. Ham, A. Hajimiri, "Concepts and Methods in Optimization of Integrated LCVCOs," IEEE Journal of Solid-state Circuits, Jun. 2001.

D. M. Pozar, Microwave Engineering, John Wiley & Sons, 2nd Edition, 1998.

Douglas R. Jachowski, "Passive Enhancement of Resonator Q in Microwave Notch Filters", IEEE MTT-S Digest, pp. 1315-1318, Jun. 2004.

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

F. X. Sinnesbichier, B Hauntz and G. R. Olbrich, "A Si/SiGe HBT Dielectric Resonator Push-Push Oscillators at 58 GHz," IEEE Microwave Guided Wave Lett. vol. 10, pp. 145-147, Apr. 2000.

F. X. Sinnesbichler and O. R. Olbrich, "SiGe HBT Push-Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, B. Hautz, G. R. Olbrich, "Low Phase Noise 58 GHz SiGe HBT Push-Push Oscillator with Simultaneous 29 GHz Output", IEEE MTT-S Digest, pp. 35-38, 2000.

F. X. Sinnesbichler, H. Geltinger, and G. R. Olbrich, "A 38 GHz Push-Push Oscillator Based on 25 GHZ-fT BJTs," IEEE Microwave Guided Wave Lett. vol. 9 pp. 151-153, Apr. 1999.

F. M. Ghannouchi, R. Larose, R.G. Bosisio, "A New Multiharmonic Loading Method for Large-Signal Microwave and Millimeter-Wave Transistor Characterization," IEEE Transactions on MTT, vol. 39, No. 6, pp. 986-992, Jun. 1991.

Franco Ramirez, Jose Lius Garcia H., Tomas Fernandez and Almudena Suarez, "Nonlinear Simulation Techniques for the Optimized Design of Push-Push Oscillators", IEEE, MTT-S Digest, pp. 2157-2160, 2003.

Franz X. Sinnesbichier, "Hybrid Millimeter-Wave Push-Push Oscillators Using Silicon-Germanium HBTs," IEEE MTT-S, vol. 51, Feb. 2003.

Franz X. Sinnesbichler, "Hybrid Millimeter-Wave Push-Push Oscillators using Silicon-Germanium HBTs," IEEE MTT-S, vol. 51, Feb. 2003.

H. Abe, Y. Aono, "11 GHz GaAs Power MESFET Load-Pull Measurements Utilizing a New Method of Determining Tuner Y-Parameters," IEEE Transactions on Microwave Theory and Techniques, vol. 27, No. 5, pp. 394-399, May 1979.

H. Stark, and J. W. Woods, Probability, Random Processes, and Estimation Theory for Engineers. New York: Prentice-Hall, 1986.

H.C. Chang, "Phase noise self-injection-locked oscillators- Theory and experiment," IEEE Transactions on Microwave Theory and Techniques, vol. 51, No. 9, pp. 1994-1999, Sep. 2003.

Hai Xiao, Takayuki Tanka and Masayoshi Aikawa, "A Ka-Band Quadruple-Push Oscillator", IEEE, MTT-S Digest, pp. 889-892, 2003.

Heng-Chia Chang, "Analysis of Coupled Phase-Locked Loops With Independent Oscillators for Beam Control Active Phased Arrays," IEEE Trans. MTT, vol. 52, pp. 1059-1065, Mar. 2004.

Heng-Chia Chang, Xudong Cao, Mark J. Vaughan, Umesh K. Mishra, and R. York, "Phase Noise in Externally Injection-Locked Oscillator Arrays," IEEE Trans. MTT, vol. 45, pp. 2035-2042, Nov. 1997.

Heng-Chia Chang, Xudong Cao, Umesh K. Mishra, and R. York, "Phase Noise in Coupled Oscillators: Theory and Experiment," IEEE Trans. MTT, vol. 45, pp. 604-615, May 1997.

Henkes, Dale D, 'Designing Short High Q Resonators', Design, Dec. 2003, pp. 75-109.

J. C. Nallatamby, M. Prigent, M. Camiade, J. Obregon, "Phase Noise in Oscillators-Leeson Formula Revisited," IEEE Transactions on Microwave Theory and Techniques, vol. 51, No. 4, pp. 1386-1394, Apr. 2003.

J. Everard, Fundamentals of RF Circuit Design with Low Noise Oscillators, John Wiley & Sons. Ltd, 2001.

J. Heinbockel and A. Mortazawi, "A Periodic Spatial Power Combining MESFET Oscillator", IEEE, MTT-S Digest, pp. 545-548, 1992.

J. Nallatamby, M. Prigent, M. Camiade and J. Obregon, "Phase Noise in Oscillators—Leeson Formula Revisited," IEEE Trans. MTT, vol. 51, No. 4, pp. 1386-1393, Apr. 2003.

J. R. Bender, C. Wong, "Push-Push Design Extends Bipolar Frequency Range," Microwave & RF, pp. 91-98, Oct. 1983.

Jeong-Geun Kim, Dong-Hyun Baek, Sang-Hoon Jeon, Jae-Woo Park and Songcheol Hong, A 60 GHz InGaP/GaAs HBT Push-Push MMIC VCO, IEEE, MTT-S Digest, pp. 885-888, 2003.

Jonathan J. Lynch and Robert A. York, "Synchronization of Oscillators Coupled through Narrow-Band Networks," IEEE Trans. MTT, pp. 238-249, Feb. 2001.

Jonathan J. Lynch and Robert A. York, "An Analysis of Mode-Locked Arrays of Automatic Level Control Oscillators," IEEE Trans. on Circuits and Systems-I, vol. 41, pp. 859-865, Dec. 1994.

Jwo-Shiun Sun, "Design and Analysis of Microwave Varactor-Tuned Oscillators", Microwave Journal, pp. 302-310, May 1999.

K. W. Kobayashi et al., "A 108-GHz InP-based HBT Monolithic Push-Push VCO with Low Phase Noise and Wide Tuning Bandwidth," IEEE J. Solid-State Circuits, vol. 34, pp. 1225-1232, Sep. 1999.

K. O. "Estimation Methods for Quality Factors of Inductors Fabricated in Silicon Integrated Circuit Process Technologies," IEEE, Journal of Solid-State Circuits, pp. 1249-1252, Aug. 1998.

Kaneyuki Kurokawa, "Noise in Synchronized Oscillators," IEEE Trans. MTT, vol. 16, pp. 234-240, Apr. 1968.

Kaneyuki Kurokawa, "The Single Cavity Multiple Device Oscillator," IEEE Trans. MTT, vol. 19, pp. 793-801, Oct. 1971.

Klaus F. Schunemann and Karl Behm, "Nonlinear Noise Theory for Synchronized Oscillators," IEEE Trans. MTT, vol. 27, pp. 452-458, May 1979.

L. Dussopt, D. Guillois, and 0. Rebeiz, "A Low Phase Noise Silicon 9 GHz VCO and an 18 0Hz Push-Push Oscillator," IEEE MTT-S. Digest, 2002, pp. 695-698.

M. Ahdjoudj, "Conception de VCO a Faible Bruit de Phase en Technologie Monolithique PHEMT dans les Bandes K et Ka," Ph.D. Thesis, Doctorat De L' Universite Pierre Et Marie Curie Paris VI, Dec. 1997.

M. Kuramitsu and F. Takasi, "Analytical Method for Multimode Oscillators Using the Averaged Potential," Elec. Communication Japan, vol. 66-A, pp. 10-19, 1983.

M. Odyniec, Editor, RF and Microwave Oscillator Design, Chapter 3: Linearity, Time Variation, and Oscillator Phase Noise, by T. Lee and A. Hajimiri, Artech House, 2002.

M. Regis, G. Llopis, and J. Graffeuil, "Nonlinear Modeling and Design of Bipolar Transistors Ultra-Low Phase-Noise dielectric-Resonator Oscillators", IEEE transactions on MTT, vol. 46, No. 10, pp. 1589-1593, Oct. 1998.

M. Schott, H. Kuhnert, J. Hilsenbeck, J. Wurlf, and H. Heinrich, "38 GHz Push-Push GaAs-HBT MMIC Oscillator," IEEE MTT-S, Digest, 2002, pp. 839-842.

M. Tiebout, "Low Power, Low-Phase-Noise, Differentially Tuned Quadrature VCO Design in Standard CMOS," IEEE- JSSS, vol. 36, pp. 1018-1024, Jul. 2001.

M. Vidmar, "A Wideband, Varactor-Tuned Microstrip VCO," Microwave Journal, Jun. 1999.

Mortazawi A and B. C. De Loach, Jr., "Multiple Element Oscillators Utilizing a New Power Combining Technique," in IEEE MTT-S Tnt. Microwave Symp. Dig., 1992, pp. 1093-1096.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

Q. Cai, J. Gerber, S. Peng, "A Systematic Scheme for Power Amplifier Design Using a Multi-Harmonic Load Pull Simulation Technique," 1998 IEEE MTT-S Symposium Digest, vol. 1, pp. 161-165, Jun. 7-12, 1998.

R. A. York and R.C. Compton, "Mode-Locked Oscillator Arrays", IEEE Microwave and Guided Wave Letter, vol. 1, pp. 215-218, Aug. 1991.

R. A. York, "Nonlinear Analysis of Phase Relationships in Quasi-Optical Oscillator Arrays," IEEE Trans. Microwave Theory Tech., vol. 41, pp. 1799-1809, Oct. 1993.

R. A. York, P. Liao, and J. J. Lynch, "Oscillator Array Dynamics with Broadband N-Port Coupling Networks," IEEE Trans. Microwave Theory Tech., vol. 42, pp. 2040-2045, Nov. 1994.

R. Adler, "A Study of Locking Phenomena in Oscillators," Proc. IEEE, vol. 61, pp. 180-1385, Oct. 1973.

R. G. Freitag, S.H. Lee, D.M. Krafcsik, D.E. Dawson and J. E. Degenford, "Stability and Improved Circuit Modeling Considerations for High Power MMIC Amplifiers", IEEE, MM-Wave Monolithic Circuits Symposium, pp. 125-128, 1988.

R. J. Hawkins, "Limitations of Nielsen's and Related Noise Equations Applied to Microwave Bipolar Transistors, and a New Expression for the Frequency and Current Dependent Noise Figure," Solid-State Electron., vol. 20 pp. 191-196, 1977.

RA. Pucel, W. Struble, R. Hallgren, U.L. Rohde, "A General Noise De-embedding Procedure for Packaged Two-Port Linear Active Devices," IEEE Transactions on MTT, vol. 40, No. 11, pp. 2013-2024, Nov. 1992.

Reidar L. Kuvas, "Noise in Single-Frequency Oscillators and Amplifiers," IEEE Trans. Microwave Theory Tech., vol. MTT-21, pp. 127-134, Mar. 1973.

Ronald G. Freitag, "A Unified Analysis of MMIC Power Amplifier Stability," IEEE, MTT-S Digest, pp. 297-300, 1992.

S. Kudszus, W. H. Haydi, A. Tessmann, W. Bronner, and M. Schlechtweg, "PushPush Oscillators for 94 and 140 GHz Applications Using Standard Pseudomorphic GaAs HEMTs," IEEE MTT-S, Microwave Symp. Digest, 2001, pp. 1571-1574.

Shigeji Nogi, Jenshan Lin and Tatsuo Itoh., "Mode Analysis and Stabilization of a Spatial Power Combining Array with Strongly Coupled Oscillators," IEEE, MTT, vol. 41, pp. 1827-1837, Oct. 1993.

Shih-Chieh Yen and Tah-Hsiung Chu, "An Nth-Harmonic Oscillator Using an N-push Coupled Oscillator Array with Voltage-clamping Circuits", IEEE, MTT-S Digest, pp. 2169-2172, 2003.

Shih-Chieh Yen and Tah-Hsiung Chu, "An Nth-Harmonic Oscillator Using an N-Push Coupled Oscillator Array with Voltage-Clamping Circuits", IEEE, MTT-S Digest, pp. 545-548, 1992.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde and A. K. Poddar, "Noise Analysis of Systems of Coupled Oscillators", (INMMIC) workshop, Italy, Nov. 15-16, 2004.

U. L. Rohde and A. K. Poddar, "Configurable Ultra Low Ultra Wideband Power Efficient VCOs", 11th European Wireless, Apr. 2005.

U. L. Rohde and A. K. Poddar, "Ultra Low Noise Low Cost Multi Octave Band VCO", IEEE Sarnoff Symposium, Princeton, NJ, USA, Apr. 2005.

U. L. Rohde, "A New and Efficient Method of Designing Low Noise Oscillators," Ph.D. Dissertation, Technical University of Berlin, Feb. 12, 2004.

U. L. Rohde, A. K. Poddar, and Juergen Schoepf, "A Unifying Theory and Characterization of Microwave Oscillator/VCO," 18th IEEE CCECEO5, May 2005, Canada.

U. L. Rohde, A. K. Poddar, and Reimund Rebel, "Ultra Low Noise Low Cost Octave-Band Hybrid-Tuned VCO," 18th IEEE CCECEOS, May 2005, Canada.

U. L. Rohde, A. K. Poddar, Juergen Schoepf, Reimund Rebel, and Parimal Patel, "Low Noise Low Cost Ultra Wideband N-Push VCO," IEEE, IMS Symposium, MTT2005, USA.

U. L. Rohde, K. Juergen Schoepf, A.K. Poddar, "Low-Noise VCOs Conquer Wide Bands," Microwaves & RF, pp. 98-106, Jun. 2004.

U.L. Rohde, A Novel RFIC for UHF Oscillators (Invited), 2000 IEEE Radio Frequency Integrated Circuits (RFIC) Symposium, Boston, MA, Jun. 11-13, 2000.

U.L. Rohde, "A Novel RFIC for UHF Oscillators (Invited)," 2000 IEEE Radio Frequency Integrated Circuits (RFIC) Symposium, Boston, MA, Jun. 11-13, 2000.

U.L. Rohde, "Improved Noise Modeling of GaAs FETS: Using an Enhanced Equivalent Circuit Technique," Microwave Journal, pp. 87-101 - Nov. 1991.

U.L. Rohde, "New Nonlinear Noise Model for MESFETS Including MM-Wave Application," First International Workshop of the West German IEEE Mfl/AP Joint Chapter on Integrated Nonlinear Microwave and Millimeter wave Circuits (INMMC'90) Digest, Oct. 3-5, 1990, Duisburg University, Germany.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

U.L. Rohde, D.P. Newkirk, RF/Microwave Circuit Design for Wireless Applications, pp. (123-197), John Wiley & Sons, Apr. 2000, ISBN 0-471-29818-2.

U.L. Rohde, D.P. Newkirk, RF/Microwave Circuit Design for Wireless Applications, pp. (123-197; Chapter 5), John Wiley & Sons, Apr. 2000, ISBN 0-471-29818-2.

Ulrich Rohde, "A New and Efficient Method of Designing Low Noise Microwave Oscillators," PhD Dissertation, Technical University of Berlin, 2004.

W. 0. Schlosser, "Noise in Mutually Synchronized Oscillators," IEEE Trans. Microwave Theory Tech., vol. MTT-16, pp. 732-737, Sep. 1968.

Wing Shing Chan et al: "The design of oscillators using the cascode circuit" Circuits and Systems, 1994, vol. 5, pp. 689-692, May 30, 1994.

Y. Baeyens et al., "Compact InP-based HBT VCOs with a Wide Tuning Range at W- and D-Band," IEEE Trans. MTT, vol. 48, pp. 2403-2408, Dec. 2000.

Y. Baeyens et al., "Compact InP-based HBT VCOs with a Wide Tuning Range at W-Band," IEEE Trans. MTT, vol. 48, pp. 2403-2408, Dec. 2000.

Y. Baeyens et al., "Compact InP-based HBT VCOs with a Wide Tuning Range at W-Band," IEEE Trans. MTT, vol. 48, pp. 2403-2408, Dec. 2001.

Y. Sun, T. Tieman, H. Pflung, and W. Velthius, "A Fully Integrated Dual-Frequency Push-Push VCO for 5.2 and 5.8GHz Wireless Applications," Microwave Journal., pp. 64-74, Apr. 2001.

Yu-Lung Tang and Huei Wang, "Triple-Push Oscillator Approach: Theory and Experiments," IEEE- JSS, vol. 36, pp. 1472-1479, Oct. 2001.

Shitikov, "Stables Shelf-Excited Oscillators of Meter and Decimeter Waves", Moscow (1983).

Kai Chang (ed.): "Encyclopedia of RF and Microwave Engineering, vol. 1-6", Apr. 2005, John Wiley & Sons, Hoboken, New Jersey, pp. 4744 - 4760.

Sun, S. et al .,"Guided- Wave Characteristics of Periodically Nonuniform Coupled Microstrip Lines-Even and Odd Modes", IEEE Transactions on Microwave Theory and Techniques, IEEE Service Center, Piscataway, NJ, US, vol. 53, No. 4, Apr. 2005, pp. 1221-1227.

* cited by examiner

MULTI-MODE
COUPLED RESONATOR

USER-DEFINABLE LOW COST, LOW NOISE, AND PHASE HIT INSENSITIVE MULTI-OCTAVE-BAND TUNABLE OSCILLATOR

CROSS-REFERENCE TO RELATED APPLICATIONS

This application claims the benefit of the filing date of U.S. Provisional Patent Application No. 60/736,901, filed Nov. 15, 2005, the disclosure of which is hereby incorporated herein by reference.

FIELD OF THE INVENTION

In general, this invention relates to a user-definable, low cost and power efficient voltage oscillator that may be tuned to operate over a fairly wide range of frequencies (e.g., multi-octave-band) while maintaining a relatively low and uniform phase noise over the tuning band.

BACKGROUND

Ultrawideband (UWB) technology has drawn considerable interest among the research and wireless communication communities due to its configurability and adaptability, which enables it to coexist with many concurrent services. YIG (yttrium-iron-garnet) based signal sources are known for their configurability, wideband tunability and ability to generate a spectrally pure signal at microwave frequencies. However, YIG based signal sources are costly, consume significant amounts of power, and are not particularly suited for fabrication by current integrated circuit (IC) technology. Nor are they immune from electromagnetic interference (EMI), vibration effects, microphonics, phase hit, and frequency modulation.

There are currently various mobile communication standards in use worldwide. Software-defined radio (SDR) enables the creation of multi-standard terminals, which may be used in various mobile communication systems by modifying their software. The coexistence of second and third generation wireless systems requires multi-mode, multi-band, and multi-standard mobile communication systems. These systems are expected to require a multi-octave-band signal source that replaces several narrow band voltage controlled oscillator (VCO) modules. In particular, it is generally desirable that these modules be replaced by a single UWB configurable spectrally pure signal source (i.e., a single voltage controlled oscillator).

Transceiver components such as VCOs, power dividers, amplifiers, and phase shifters are usually required to be capable of wideband performance to cover the frequency bands of various systems. The different standards operating in the frequency range of up to 6 GHz, and even higher frequencies with the introduction of UWB techniques, give rise to the need for wideband tunable sources. They also provide additional utility to a multi-standard radio frequency (RF) transceiver that combines several cellular and cordless phone standards as well as wireless LAN functionalities in one unit. This places more demand on the topologies and technologies used to implement reconfigurable multi-octave-band signal source operation with low-power and low phase noise characteristics. As the frequency band for wireless communications shifts higher, generation of a power efficient ultra low noise wideband and thermal stable compact signal at a low cost becomes more challenging due to the frequency limitations of the active devices. A high frequency signal can be generated either based on an oscillator operating at a fundamental frequency or a harmonic frequency.

Various approaches, such as frequency multipliers, switching between VCOs for separate bands, utilizing inter-modal multiple frequency, using switched resonators for band selection, are promising. These approaches result, however, in circuits having relatively large sizes that consume relatively large amounts of power, provide relatively poor noise performance and that are not cost effective. The drawback of a band-switching approach is power consumption and, where PIN diodes are employed, extra noise due to the switching spike generated from the PIN diodes.

More specifically, the use of signal frequency doublers or triplers in oscillators to multiply the frequency has disadvantages in that spurious signals are always present in the output. These spurious signals must be filtered out to avoid degrading receiver performance or causing interference with other radio services. In addition, the parts count increases greatly with doublers and triplers and the desired output frequencies must exactly match those multiples.

Phase noise is the noise that results from modulations in the oscillation or carrier frequency, of an oscillator and affects an oscillator's ability to be tuned precisely. In general, phase noise increases with frequency doubling and tripling. Furthermore, the phase noise performance of VCOs is becoming increasingly important with reduced communications channel spacing and more heavily loaded data transmissions. A wide tuning range and ultra low phase noise represent tradeoffs in the design of a VCO, impacting both the technology and the topology used. Multi-octave-band tunability and good phase noise performance have typically been assumed to be opposing requirements due to the problem of controlling the loop parameters and optimization of the time average loaded Q of the resonator over the band simultaneously.

There are a number of operational parameters that are of concern in oscillator operation depending on the oscillator's intended applications, but phase noise is an important figure of merit for measurement and instrumentation applications. For oscillators intended for fixed frequency operation it is relatively easy to optimize the parameters of particular concern. A problem is encountered, however, when the oscillator is tuned to operate over a wideband frequency range. For a varactor-tuned oscillator to continuously tune over a multi-octave-band, the tuning diode must typically exhibit a large change in capacitance in response to a small change in the tuning voltage. However, this enables the tuning diode's own capacitance to be easily modulated by the random electronic noise signals generated internally by various oscillator circuit elements, including the tuning diode itself. The tuning range of the VCOs directly influences the phase noise and there is a trade-off between the continuous multi-octave-band tunability of a VCO and the amount of phase noise generated by the varactor capacitance modulation. Low phase noise performance over the complete frequency range is a demanding requirement.

As mentioned above, some oscillators use PIN diodes. A disadvantage of PIN diodes in oscillators is that PIN diodes require significant DC current to obtain a low "ON" impedance, and when the PIN diodes are "OFF" they can create high levels of harmonically related spurious signals, losses and distortions. Furthermore, tank circuits associated with the PIN diodes reduce circuit Q, which reduce efficiency, and cause higher phase noise in the output circuit.

As also mentioned above, YIG resonator-based oscillators are well-known as wideband tunable voltage controlled oscillators, but at the cost of size, power and integrability in integrated circuit (IC) form. A YIG resonator is a magnetic insulator that resonates at a microwave frequency in the presence of the magnetic field. If the resonator is spherical, the frequency of resonance is related only to the strength of the magnetic field and not to the radius of the sphere. YIG resonators are usually made of either single-crystal yttrium iron garnet or gallium-substituted yttrium iron garnet. In a YIG oscillator, a YIG sphere is used as a reactive component, and it is placed in a magnetic field to set its resonant frequency. For a tunable YIG oscillator, the YIG sphere is placed in the air gap of an electromagnet, and the current applied to the windings is varied as desired in order to obtain the desired frequency of oscillation. Consequently, YIG oscillators are usually large, heavy and consume relatively large amounts of power, and therefore are not typically suited to fabrication by current IC technology. In addition, YIG based oscillators are usually sensitive to vibration, microphonics, phase hits, and frequency-agility.

In that regard, a transceiver module may presently be implemented on a single IC chip, except for the YIG stage resonators. Therefore, to reduce the transceiver cost on a single IC chip, it is desirable to eliminate the YIG resonator. One way to eliminate the YIG resonator is to use a planar resonator. But a planar resonator suffers from a relatively low Q (quality factor) and is therefore susceptible to phase noise.

To solve the frequency-agility issue, radio manufacturers that serve the point-to-point and point-to-multi-point markets generally prefer to use an oscillator that is configurable, wideband tunable and provides relatively low phase noise. This avoids a YIG based signal source so as to provide higher transmission speeds at reduced cost and power. Such oscillators may then be advantageously used for present and later generation communication systems.

Unlike conventional signal sources (i.e., conventional oscillators/VCOs), a YIG based oscillator's quality factor (Q) increases with frequency, particularly at millimeter wave frequencies. A YIG based synthesizer provides low noise performance and is broadband tunable when compared to the standard signal sources. However, a YIG based oscillator requires a significant amount of power (>24V, 100 mA). This results in generation of excessive heat, which may harm the other electronic components in the transceiver modules. In addition, YIG based oscillators are usually prone to vibration, lighting, electromagnetic interference (EMI), microphonics, phase hits, and frequency modulation, all of which have a detrimental effect in designing modern communication systems. The above effects may cause interruptions in the carrier signal and affect the radio's bit-error-rate (BER).

In the past, YIG oscillators have employed either a FET or a bipolar transistor as the active device coupled to the YIG resonator. FETs can generally operate at higher frequencies than bipolar transistors, but bipolar transistors have significantly better 1/f noise characteristics. No single broadband device has been available that can be tuned to frequencies with both the bipolar and FET microwave frequency ranges. Attempts have been made to increase the high frequency limit of bipolar transistor-based YIG oscillators by increasing the high frequency limit of the transistors, but these transistors have also tended to have higher minimum frequencies of operation. Further, YIG oscillator circuits are usually designed to either operate at low frequencies or high frequencies. It is usually challenging and difficult to design a single circuit, which may be tunable as a broadband source.

In view of the limitations of known YIG resonators for integrability and power-effective operation, there is a need for compact size oscillators that support multi-octave-band tunability and that are amenable to integration in chip form. In addition, there is a need for a broadband tuned oscillator packaged as a single device that can be used in place of the YIG oscillator.

SUMMARY OF THE INVENTION

An aspect of the present invention is an oscillator that is operable over a range of oscillating frequencies. For example, the oscillator preferably comprises a transistor having base, emitter and collector terminals and a multi-mode coupled resonator coupled across the base and collector terminals through a dynamically tunable capacitive element. In addition, the oscillator preferably includes a slow-wave coupled resonator and a progressive-wave coupled resonator coupled in series to the collector terminal.

In accordance with this aspect of the present invention, a noise filtering network may be coupled across the base and collector terminals of the transistor. In addition, a noise cancellation network may also be coupled across the base and collector terminals of the oscillator.

Further in accordance with this aspect of the present invention, the oscillator may further desirably comprise a noise feedback and bias network coupled across the base and collector terminals. The oscillator may further desirably comprise a phase compensating network capacitively coupled between the base and collector terminals through the slow-wave and progressive-wave coupled resonators. Further still, it may be desirable that the oscillator further includes a distributed coupled medium coupled between the slow-wave and progressive-wave coupled resonators.

Further in accordance with this aspect of the present invention, the multi-mode resonator may comprise an electromagnetically coupled resonator. In addition, the electromagnetically coupled resonator may further desirably comprise at least two planar coupled resonators. Further still, the oscillator may further desirably allow the effective coupling across the planar coupled resonators to be dynamically adjusted so as to provide a user selectable frequency band.

Further still in accordance with this aspect of the present invention, the oscillator further desirably comprises a tuning network coupled to the multi-mode coupled resonator, the tuning network being operable to tune the oscillation frequency.

In accordance with this aspect of the present invention, the oscillator is desirably implemented on a printed circuit board such that the resonator comprises a planar resonator that may be implemented on a surface or in a buried layer of the board.

In another aspect, the present invention comprises a voltage controlled oscillator having an oscillating frequency and that includes a transistor having first, second and third terminals; a dual mode electromagnetically coupled resonator coupled to the third terminal; and at least two tuning diodes coupled across the dual mode electromagnetically coupled resonator. Preferably, the tuning diodes are operable as variable capacitors to tune the oscillating frequency of the oscillator.

In accordance with this aspect of the present invention, the dual mode electromagnetically coupled resonators preferably comprises a pair of inductively coupled distributed transmission lines. Further, the dual mode electromagnetically coupled resonator may comprise a micro-stripline coupled resonator. Further still, the dual mode electromagnetically coupled resonator may comprise a stripline coupled resonator.

Further in accordance with this aspect of the present invention the transistor preferably desirably comprises a parallel emitter configured bipolar transistor having base, collector and emitter terminals that respectively comprise the first, second and third terminals of the transistor.

In a further aspect, the present invention comprises a communication device. The communication device preferably comprises a module for transmitting or receiving information, and a multi-octave band tunable oscillator coupled to the module. The tunable oscillator preferably comprises a transistor having first, second and third terminals; a plurality of planar resonators electromagnetically coupled to each other and to the transistor and an active bias network coupled to the transistor and operable to provide a substantially constant bias voltage to the transistor.

In accordance with this aspect of the present invention, the communication device may desirably comprise a telephone, a personal digital assistance, a computer or a laptop. In general, the communication device may comprise any electronic apparatus that is capable of transmitting or receiving information or that generally employs a phase lock loop to recover or transmit such information.

In accordance with an aspect of the present invention, a cost-effective method for manufacturing a low phase noise integrated wideband VCO, which may replace a YIG resonator-based voltage controlled oscillator/VCO, is provided. Although the YIG resonator based VCO offers low phase noise and multi-octave-band tunability, it requires a significant amount of power to operate (typically >24V and 100 mA) and is also not amenable for integration in chip form. Nor are they immune to electromagnetic interference (EMI), vibration effects, microphonics, phase hits, and frequency modulation. For example, the typical phase noise of the YIG resonator based wideband oscillator is typically 100 dBc/Hz @100 kHz for a frequency band of 2000-6000 MHz, and moreover, it is difficult to operate YIG oscillator below 2000 MHz frequency. In one aspect, the present invention is a replacement oscillator for the YIG (which may be conveniently referred to as an YRO) as a UWB configurable signal source, which is cost effective and easily amenable for integration in IC form.

In another aspect, the present invention provides a new topology for the wideband oscillator and offers a cost-effective alternative to the YIG resonator based wideband VCO in the L (approximately 0.39-1.55 GHz), S (approximately 2.0-4.0 GHz), and C (approximately 4.0-6.0 GHz) frequency bands. A VCO implemented in accordance with the various aspects of the present invention may serve as a multi-octave-band signal source for present day and future generation communication systems. The measured phase noise performance of VCOs implemented in accordance with one or more aspects of the present invention is typically better than −120 dBc/Hz @100 kHz offset from the carrier for the frequency band (600-6000 MHz), and is not limited to these frequencies. The freedom of selection of the frequency, low phase noise, low phase hits, low power consumption, multi-octave-band tunability, compact size, and stability over temperature is expected to make this technology promising and attractive for next generation high frequency mobile communication systems, as well as test and measuring instruments. Other features and advantages of the present invention include power efficiency (5V, 15 mA), ultra low phase noise, and amenability to integration in chip form.

An aspect of the present invention is a method for increasing the tuning bandwidth and improving the phase noise in a voltage controlled oscillator that employs a planar coupled progressive delay resonator integrated with a varactor diode or other semiconductor device as a tuning element. This approach allows for a substantial reduction in phase noise by dynamically varying the impedance transfer function and coupling factor across the guided distributed medium of the planar-coupled resonator network.

Another aspect of the present invention is the provision of a manufacturing method for making a spectrally pure multi-octave-band oscillator, which is compact and amenable for integration in chip form.

Another aspect of the present invention is the provision of a multi-octave-band tunable voltage controlled oscillator suitable for use in instruments that require a broad range of frequencies, such as spectrum analyzers, frequency synthesizers, sweepers or the like. In addition, there are many other uses for a broadband range of frequencies. Conventional spectrum analyzers have used magnetically tunable YIG oscillators to support wideband tunability. The conventional multi-octave, wideband voltage controlled YIG oscillator is usually in the form of a bank of several voltage controlled oscillators. Each individual oscillator is selectable on command by turning on the desired oscillators, while the others remain off. The outputs are wired together so that the selected output is available to respective ports without loss of power. In accordance with the various aspects of the present invention, these shortcomings are avoided. In particular, the oscillator may be implemented in integrated circuit form.

In another aspect, the present invention comprises a microstripline coupled-resonator that may be characterized as an evanescent mode buffer based on progressive delay, which eventually improves the time average loaded Q of the integrated planar coupled resonators over the multi-octave-band operation. An oscillator of the present invention may include as a feature an integrated EM coupled resonator in lieu of the conventional LC or microstripline resonator circuit and the phase shift is adjusted by varying the tuning diode across the base and collector.

In another aspect, wideband tunability is provided through a tuning network that supports more than octave band tunability without degradation of the loaded Q of the resonator circuit. The voltage may be tuned over both a wide range for purpose of coarse tuning and over a narrow range for purpose of the fine-tuning.

DETAILED DESCRIPTION

Figure 1:
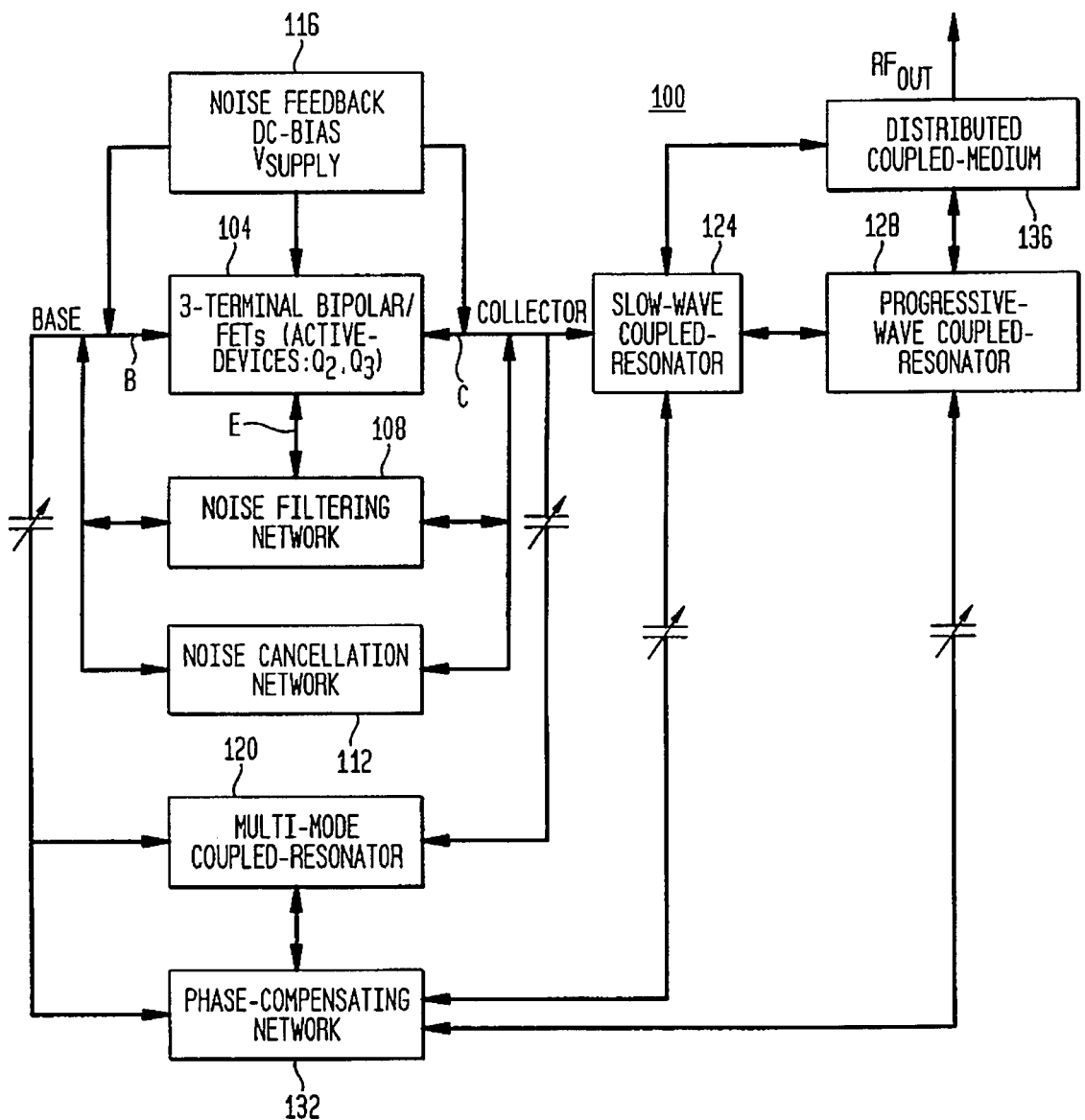
FIG. 1 illustratively depicts a functional block diagram of a voltage controlled oscillator in accordance with an aspect of the present invention.

FIG. 1 is a block diagram illustrating the functional circuit elements of a voltage controlled oscillator 100 in accordance with an aspect of the present invention. The oscillator 100 includes an active element 104. In the preferred embodiment, the active element comprises a three terminal bipolar transistor that includes a base terminal (B), an emitter terminal (E) and a collector terminal (C). In general however, the active element may include any three terminal device which is operable to provide a 180 degree phase shift between any of its two terminals. Thus, it may also include a FET or any other type of transistor.

A noise filtering network 108 and a noise cancellation network 112 are connected in parallel between the base and collector terminals. A noise feedback and DC bias circuit 116 is also coupled across the base and collector terminals of the active device 104. In the preferred embodiment, the circuit 116 comprises an active feedback network that compensates for changes in the DC bias power supply voltage owing to changes in the operating temperature of the oscillator or its environment. A multi-mode coupled resonator network 120 is capacitively coupled across the base and collector terminals. A slow-wave coupled resonator 124 and a progressive-wave coupled resonator 128 are coupled in series at the collector terminal. A phase compensating network 132 is capacitively coupled between the base terminal and the slow-wave and progressive-wave coupled resonators 124, 128. An RF output signal is coupled through a distributed coupled medium 136. In addition, the distributed coupled medium 136 is coupled across the slow-wave and progressive-wave resonator networks 124, 128.

The topology depicted in FIG. 1 is based on what we conveniently refer to as multi-coupled-slow-wave (MCSW) planar resonators. As is described in further detail below, this approach supports multi-octave tuning in a small package, and is compatible with integrated circuit fabrication processing. In addition, the topology allows for a substantial reduction in phase noise by dynamically optimizing the impedance transfer function and coupling factor across a guided distributed median of the planar multi-coupled network. Oscillators implemented in accordance with the architecture of FIG. 1 are made by the assignee of the present application, Synergy Microwave Corp., as part of its distributed coupled YIG voltage-controlled oscillators.

As an MCSW VCO is planar and broadband in nature, it is suited for cost-effective, monolithic-microwave-integrated-circuit (MMIC) fabrication. With the potential to enable wide operational bandwidths, eliminate discrete resonators (such as a YIG sphere), and produce high-quality-factor (high-Q) planar resonators for low-noise VCOs by means of a planar fabrication process compatible with existing IC and MMIC processes, the MCSW VCO is a promising technology for present and future broadband communications requirements. The MCSW, for example, is well suited for use in microwave communications systems, test equipment, radar, local multi-point-distribution systems (LMDS), and multichannel multi-point-distribution systems (MMDS).

With reference to FIG. 1, the active impedance created by the three-terminal active device 104 (e.g., a field-effect transistor or biopolar transistor) in a MCSW oscillator has a negative real part with a real magnitude and an imaginary part with an imaginary magnitude. The real magnitude is a function of the imaginary magnitude. The imaginary magnitude is selected such that the real magnitude compensates for the loss of the MCSW resonator. The selection of the imaginary magnitude should also coincide with the maximum-slope inflection point of the oscillator's phase characteristic cure, in order to optimize group-delay performance. The mode coupling approach also includes a methodology for optimum dynamic coupling. Optimum coupling enhances the dynamic loaded Q, reduces or eliminates phase hits, diminishes susceptibility to microphonics (to an extremely low level), and minimizes phase noise while achieving a broadband linear tuning range.

The multi-mode coupled resonator network 120 shown in FIG. 1 is capacitively coupled across the base and collector terminal of the three-terminal active device 104. This arrangement can be characterized as a high-Q multiplier based on evanescent-mode progressive delay that eventually improves the time average loaded Q of the planar resonator over its multioctave operating. The slow-wave and a progressive-wave-coupled resonators 124, 128 (coupled through hybrid resonance mode convergence effect) connected through the phase-compensating network 132 across the collector and base of the three-terminal active device supports self-injection locking mechanism over multioctave-band. In addition, the phase compensating network 132 (capacitively coupled between the base terminal and the slow-wave and progressive-wave coupled resonators) also optimizes group delay dynamically for uniform and minimum phase-noise performance over the band. As the RF output signal is coupled through a distributed coupled medium, which is coupled across the slowwave and progressive-wave resonator networks, uniform output power and improved higher-order harmonic rejection through out the operating frequency band can be achieved.

Figure 2A:
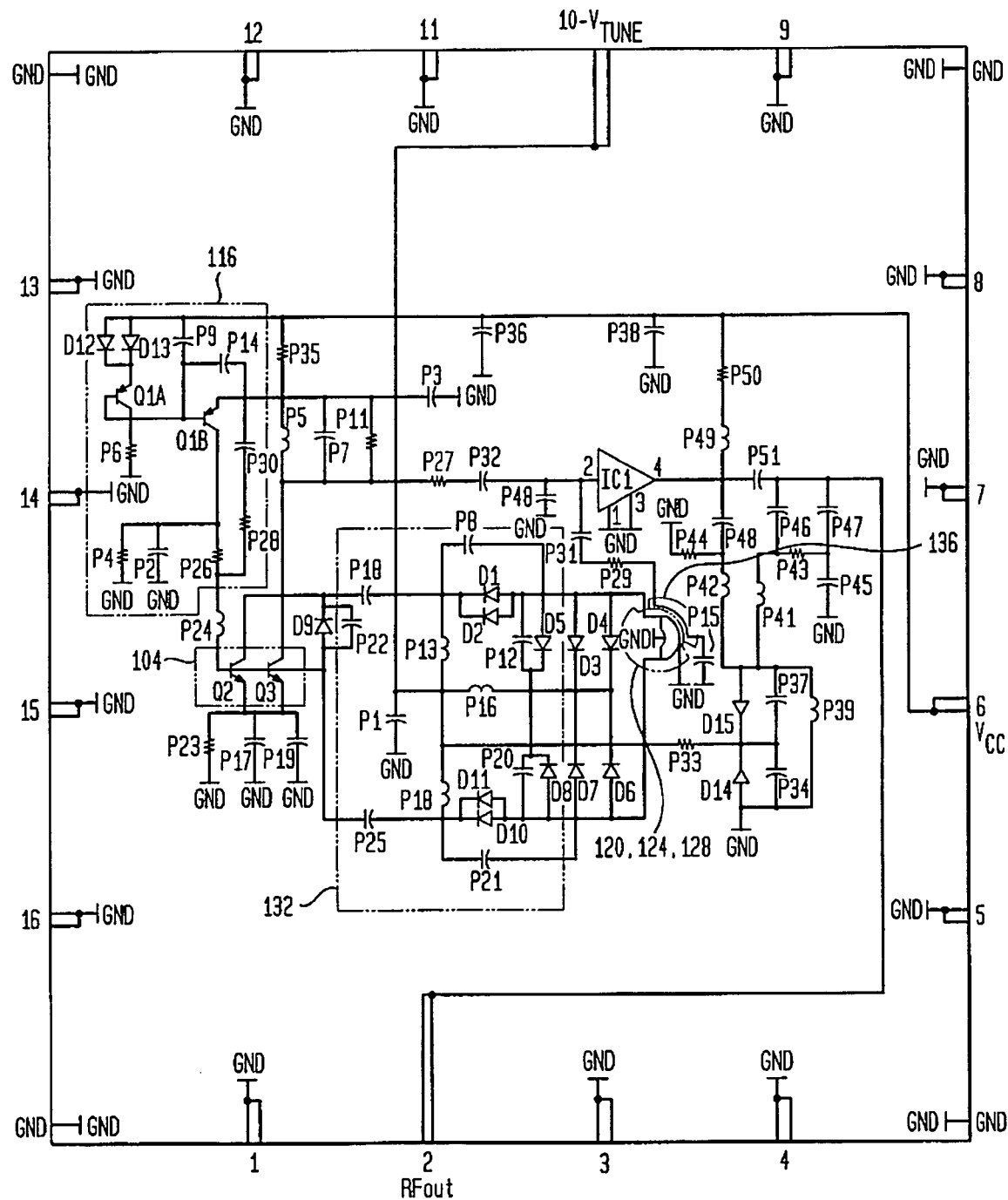
FIG. 2A illustratively depicts a schematic circuit diagram of a voltage controlled oscillator in accordance with an aspect of the present invention.
Figure 2B:
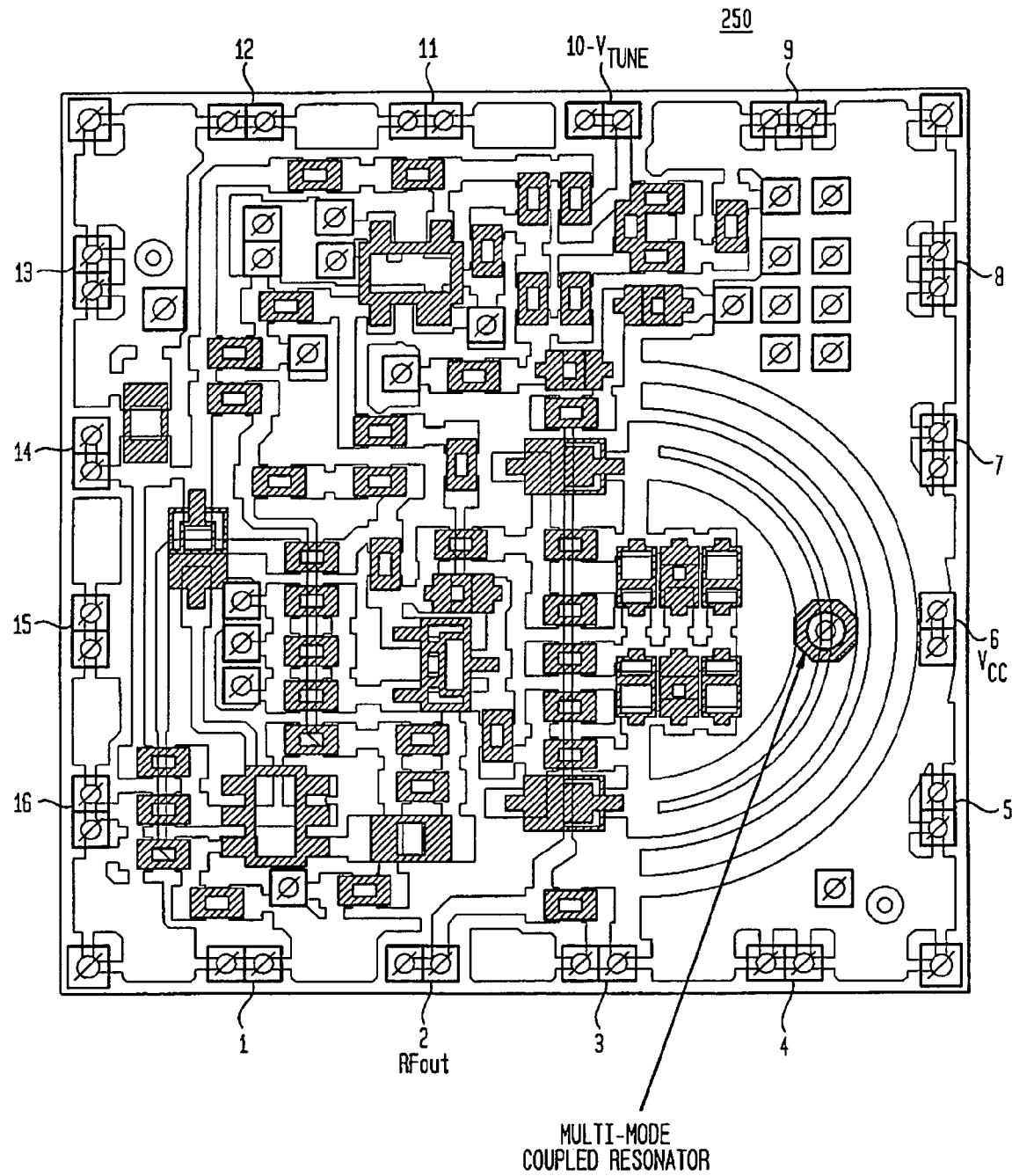
FIG. 2B illustratively depicts a printed circuit board layout diagram of an oscillator in accordance with an aspect of the present invention.

FIGS. 2A and 2B respectively illustrate circuit schematic and printed circuit board (PCB) layout diagrams of a VCO (300-900 MHz) constructed in accordance with an aspect of the present invention. The measured phase noise of this oscillator is typically better than −120 dBc/Hz @100 kHz offset from the carrier frequency over the band (300-900 MHz).

In particular, FIG. 2A shows a circuit schematic of a voltage controlled oscillator 200 implemented in accordance with FIG. 1. In addition, FIG. 2A shows the discrete elements comprising the oscillator 200 and how they may be connected and implemented on a printed circuit board. As is shown in FIG. 2A, a bias or supply voltage $V_{CC}$ is provided at pin 6. The supply voltage $V_{CC}$ is coupled to the noise feedback and DC bias network 116. The network 116 comprises appear of transistors Q1A and Q1B. These transistors in combination with the other elements shown in the network 116 provide for active biasing of the supply voltage over the operating temperature range. In general, the transistor Q1A acts as a reference voltage that has a temperature coefficient due to the temperature characteristics of the transistor. The transistor Q1B functions as a bias transistor. In practice, the transistors Q1A and Q1B are matched and, as is shown in FIG. 2B, can be realized on a common integrated circuit.

The noise feedback and DC-bias network 116 is connected between the collector and base of the active device 104. As is shown in FIG. 2A, the active device 104 may comprise a pair of transistors Q2, Q3 connected as shown. The phase compensating network 132 is implemented using the discrete elements shown on FIG. 2A. As FIG. 2A also shows, the coupled resonators 120, 124 and 128 are illustratively depicted as comprising a semi-circular planar resonator element. In addition, the distributed coupled medium is shown as the semi-circular line 136.

The circuits schematic shown in FIG. 2A may be implemented as an integrated circuit as is shown FIG. 2B. The oscillator 250 of FIG. 2B, provides multi-octave band tunability over a range of 300-900 MHz. The tuning range may be achieved by adjusting the voltage applied at pin 10. As FIG. 2B also shows, in this implementation the circuit includes only the multi-mode coupled resonators.

Figure 3A:
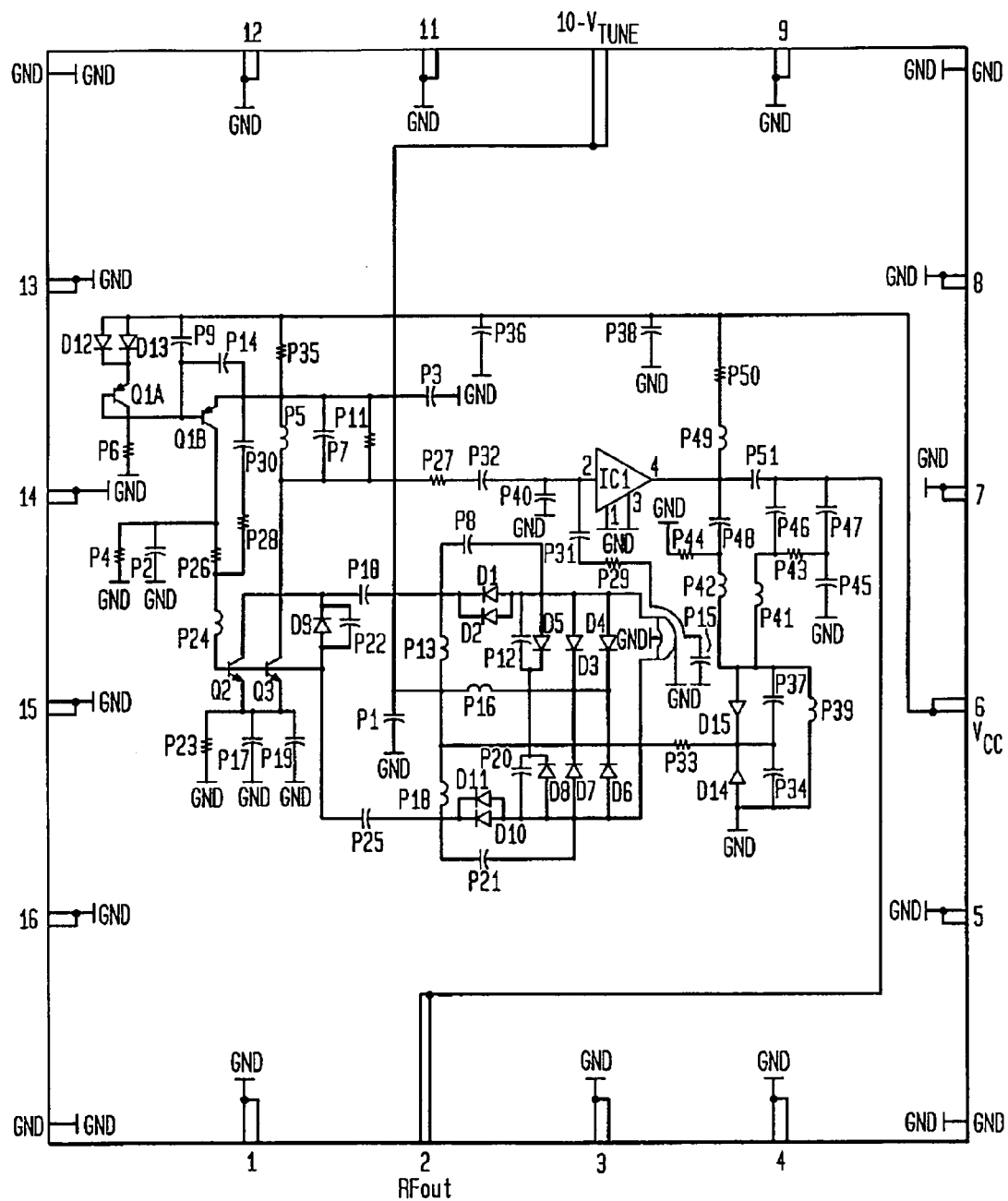
FIG. 3A illustratively depicts a schematic circuit diagram of a voltage controlled oscillator in accordance with an aspect of the present invention.
Figure 3B:
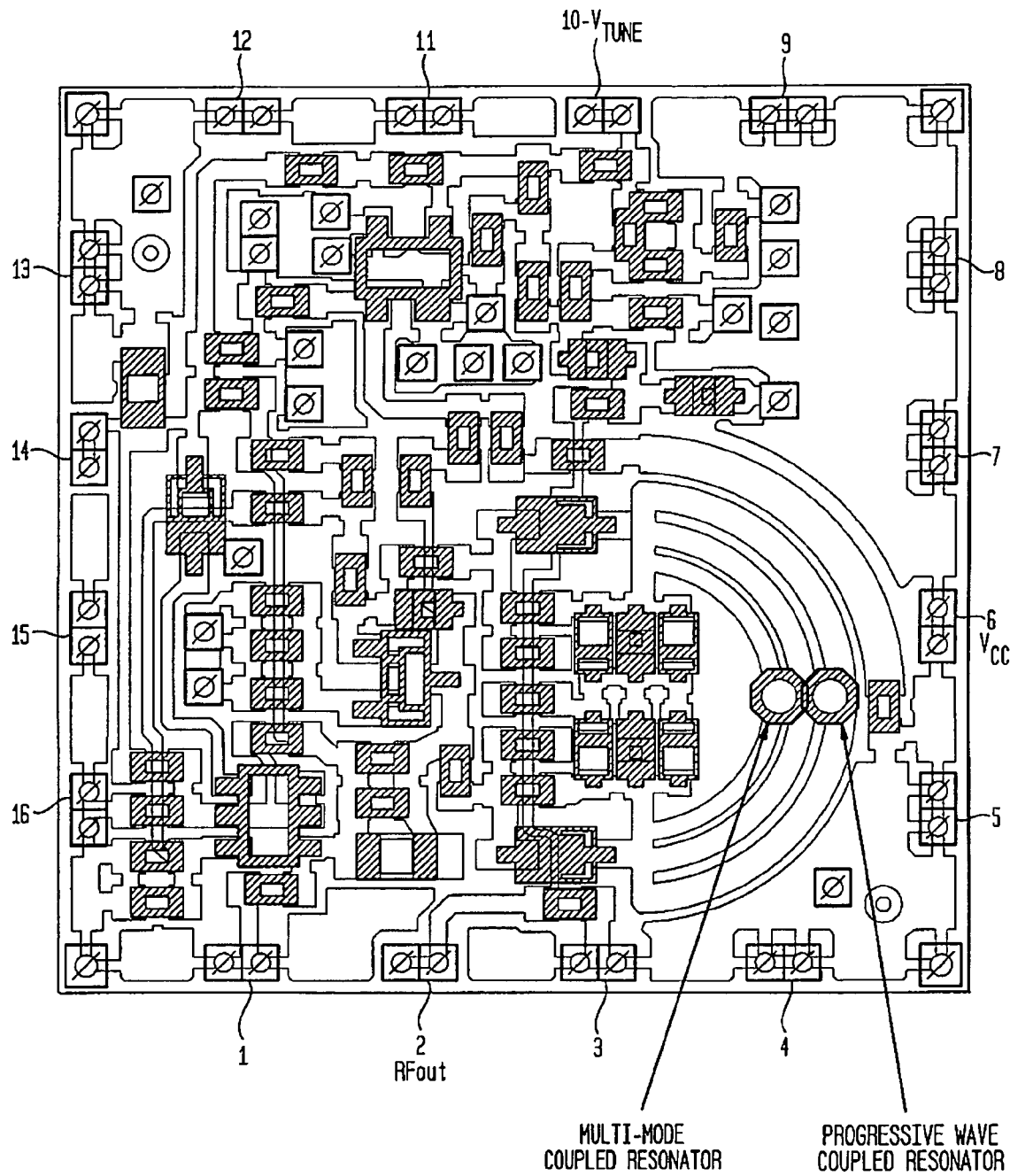
FIG. 3B illustratively depicts a printed circuit board layout diagram of a voltage controlled oscillator in accordance with an aspect of the present invention.

FIGS. 3A and 3B respectively illustrate a circuit schematic PCB and layout diagram of a VCO (300-1200 MHz) implemented in accordance with an aspect of the present invention. The measured phase noise of this oscillator is typically better than −130 dBc/Hz @100 kHz offset from the carrier frequency over the band (300-1200 MHz). The circuit schematic of FIG. 3A shows the arrangement of discrete elements comprising the voltage controlled oscillator 300 on a printed circuit board. The elements shown in FIG. 3A operates similarly to like number elements in FIG. 2A and form the same functional blocks in FIG. 2A as those blocks relate to FIG. 1. FIG. 3B, as previously noted is an implementation of a schematic of FIG. 3A, but includes a progressive wave resonator in addition to a multi-coupled resonator. The circuits of FIGS. 3A and 3B are chosen so that the oscillator is tunable over the frequency band of 300 to 1200 MHz, which provides multi-octave band tunability.

Figure 4A:
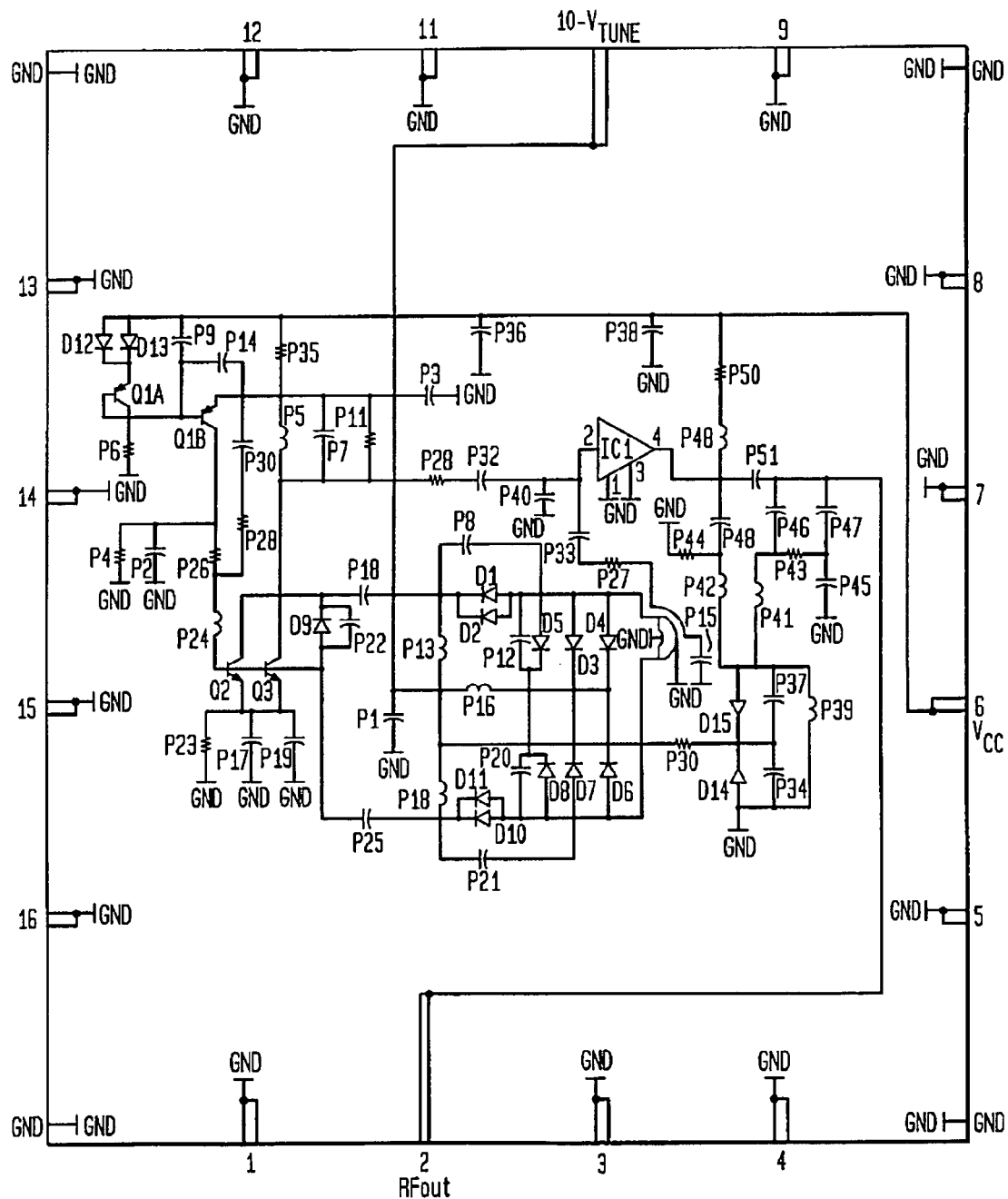
FIG. 4A illustratively depicts a schematic circuit diagram of a voltage controlled oscillator in accordance with an aspect of the present invention.
Figure 4B:
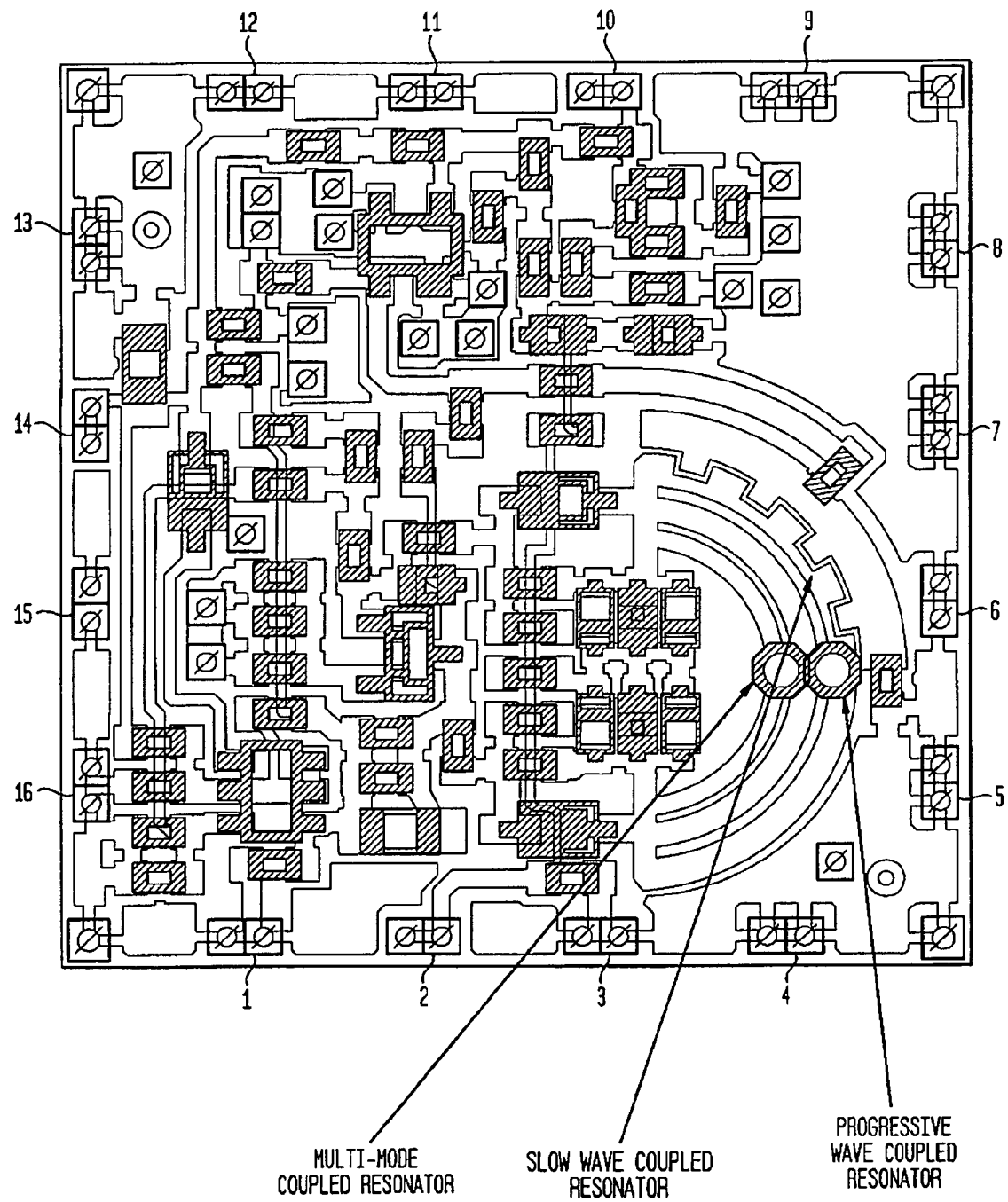
FIG. 4B illustratively depicts a printed circuit board layout diagram of a voltage controlled oscillator in accordance with an aspect of the present invention.

FIGS. 4A and 4B respectively illustrate a circuit schematic and PCB layout diagram of a VCO (300-1800 MHz) constructed in accordance with an aspect of the present invention. The measured phase noise is better than −130 dBc/Hz @100 kHz offset from the carrier frequency over the band (300-1800 MHz). More particularly, FIG. 4B shows the IC layout of the discrete elements of FIG. 4A. FIG. 4B, in addition to having a multi-mode and progressive coupled resonators also includes a slow wave coupled resonator. Each of these resonators are planar in form and electromagnetically coupled to each other. As explained above the electromagnetic-coupling between these resonators provide for the wideband tunability and other performance benefits associated with these oscillators. As is also shown, the slow wave coupled resonator comprises a planar structure having projections that mate with openings. FIGS. 4A and 4B are also based on the functional block diagram of FIG. 1 and illustrate another embodiment of FIG. 1.

Figure 5A:
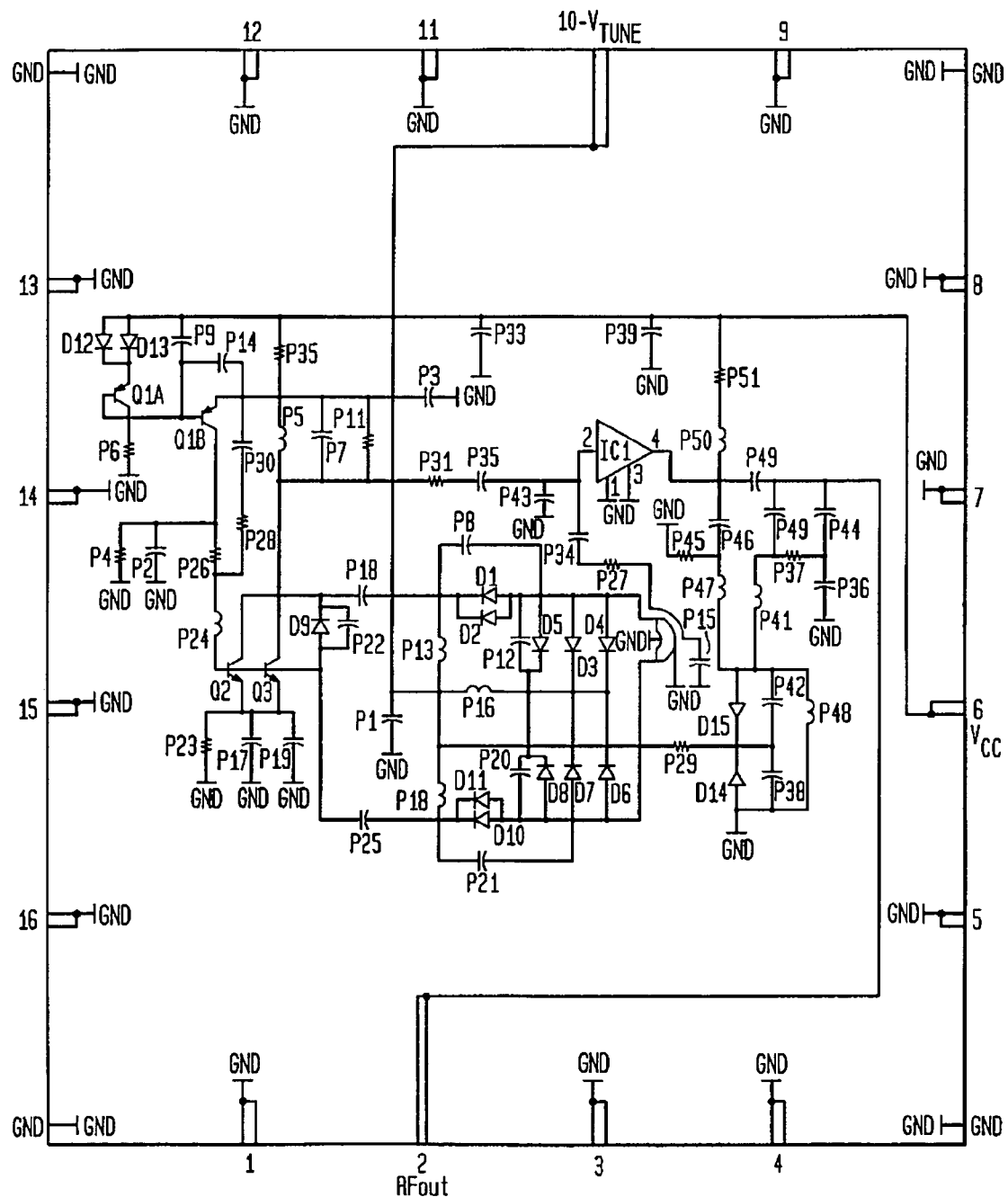
FIG. 5A illustratively depicts a schematic circuit diagram of a voltage controlled oscillator in accordance with an aspect of the present invention.
Figure 5B:
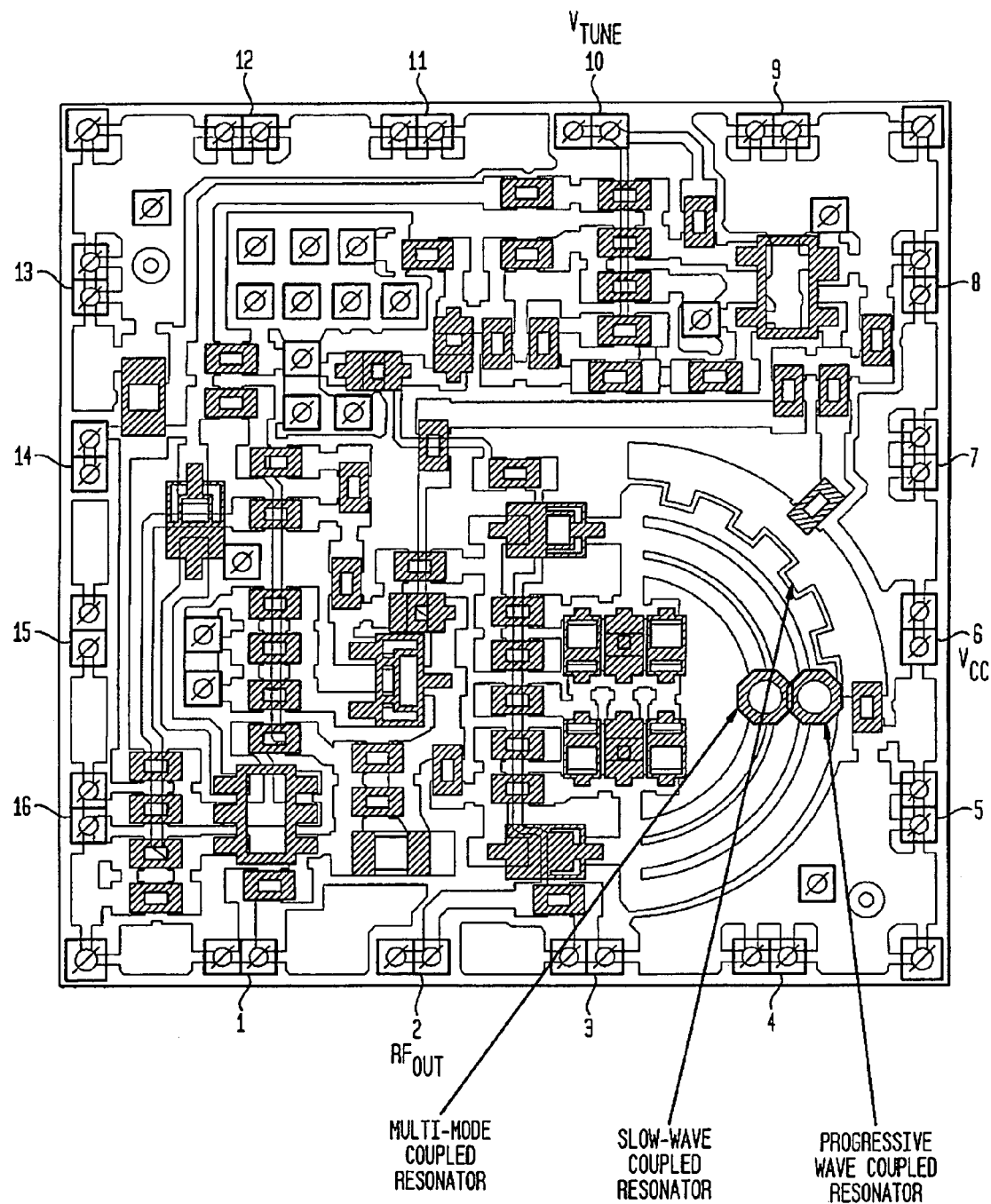
FIG. 5B illustratively depicts a printed circuit board layout diagram of a voltage controlled oscillator in accordance with an aspect of the present invention.

FIGS. 5A and 5B respectively illustrate a circuit schematic and PCB layout diagram of a VCO (600-3000 MHz) constructed in accordance with an aspect of the present invention. The measured phase noise is better than −120 dBc/Hz @100 kHz offset from the carrier frequency over the band (600-3000 MHz). These figures show another embodiment of an oscillator operating in accordance with the block diagram of FIG. 1.

Figure 6A:
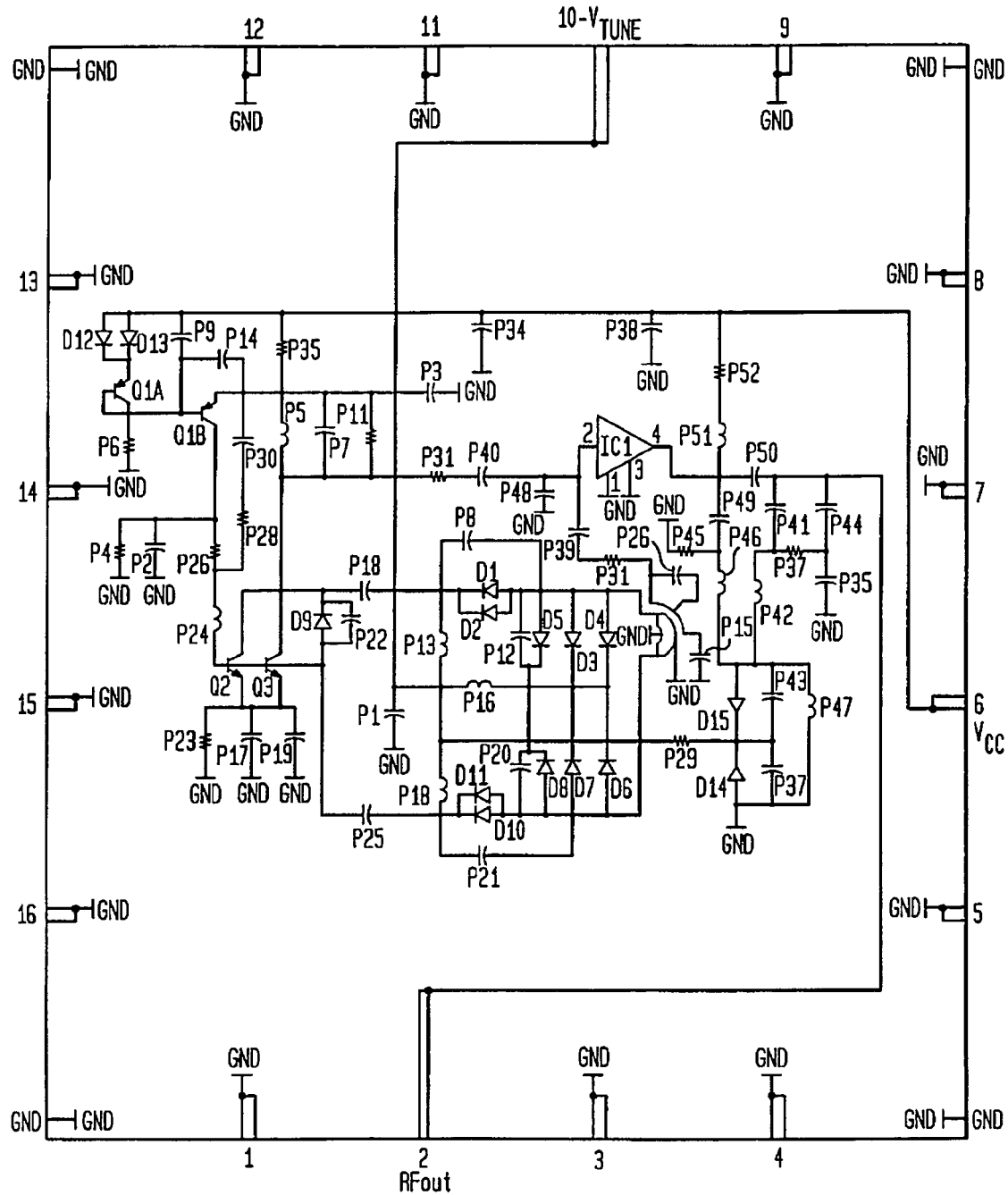
FIG. 6A illustratively depicts schematic circuit diagram of a voltage controlled oscillator in accordance with an aspect of the present invention.
Figure 6B:
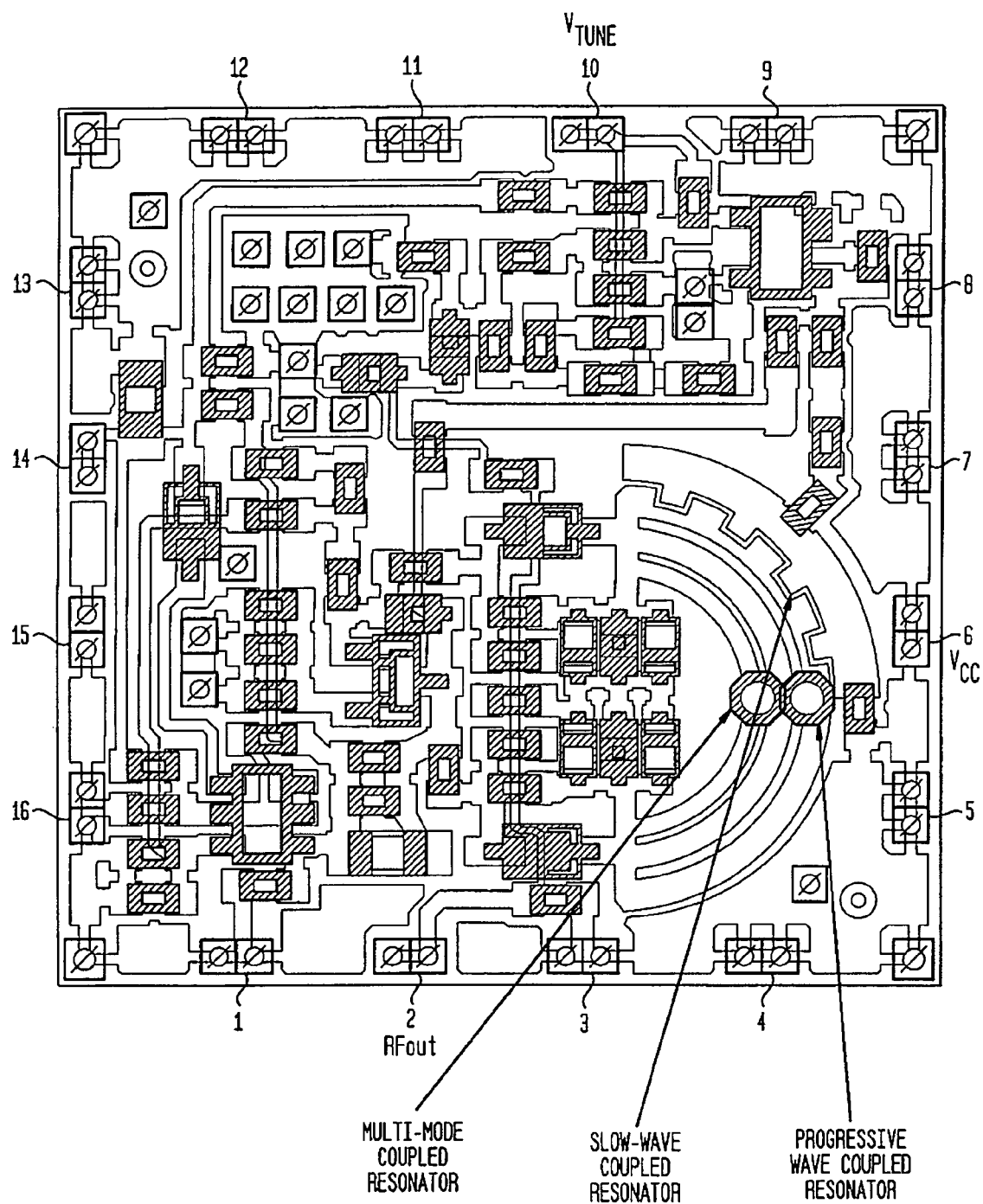
FIG. 6B illustratively depicts a printed circuit board layout diagram of a voltage controlled oscillator implemented in accordance with an aspect of the present invention.

FIGS. 6A and 6B respectively illustrate a circuit schematic and PCB layout diagram of a VCO (600-4200 MHz) constructed in accordance with an aspect of the present invention. The measured phase noise of this oscillator is typically better than −110 dBc/Hz @100 kHz offset from the carrier frequency over the band (600-4200 MHz). These figures also show another embodiment of an oscillator operating in accordance with the block diagram of FIG. 1.

Figure 7A:
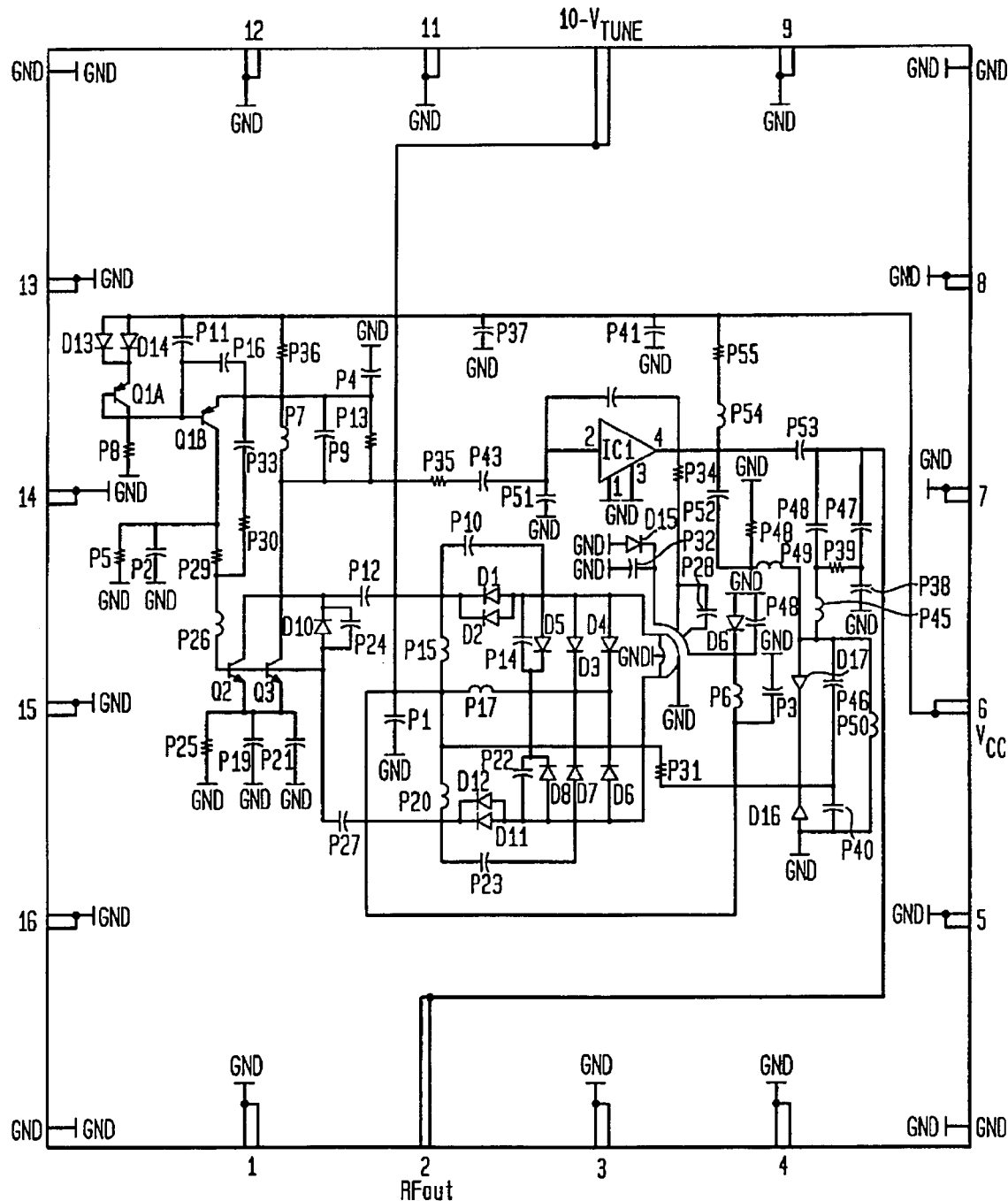
FIG. 7A illustratively depicts a schematic circuit diagram of a voltage controlled oscillator in accordance with an aspect of the present invention.
Figure 7B:
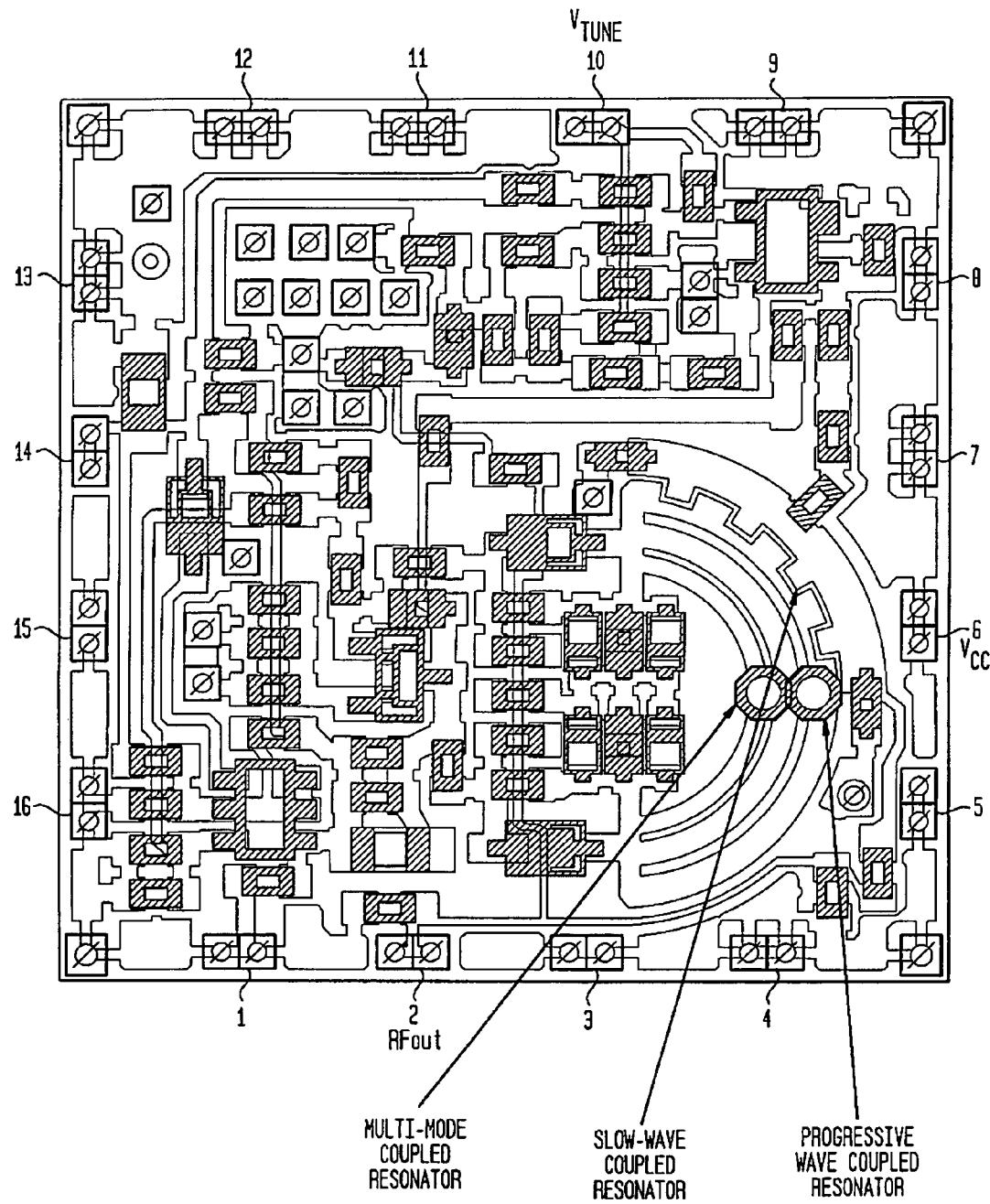
FIG. 7B illustratively depicts a printed circuit board layout diagram of a voltage controlled oscillator implemented in accordance with an aspect of the present invention.

FIGS. 7A and 7B illustrate respectively a circuit schematic and PCB layout diagram of the VCO (600-6000 MHz) constructed in accordance with an aspect of the present invention. The measured phase noise of this oscillator is typically better than −120 dBc/Hz @100 kHz offset from the carrier frequency over the band (600-6000 MHz). These figures also show another embodiment of an oscillator operating in accordance with the block diagram of FIG. 1.

Figure 8:
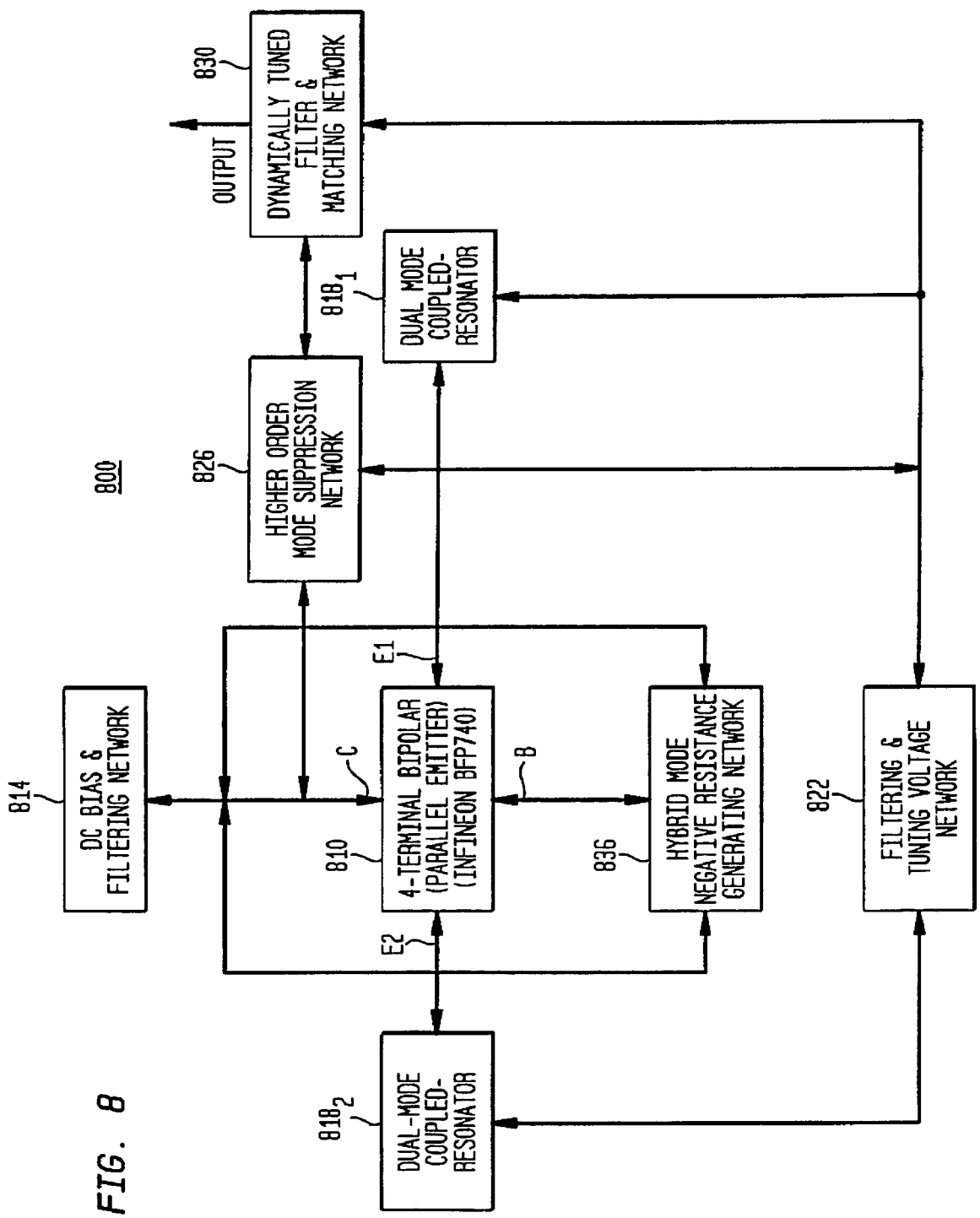
FIG. 8 illustratively depicts a functional block diagram of a voltage controlled oscillator implemented accordance with an aspect of the present invention.

FIG. 8 is a block diagram depicting the functional modules of a voltage controlled oscillator 800 in accordance with an aspect of the present invention. The oscillator 800 includes an active device 810 having four terminals. In a preferred embodiment, the device 810 may comprise a four terminal bipolar transistor in a parallel emitter configuration. Most preferably, the device 810 may comprise Infineon's BFP 740 transistor. As shown, the device 810 is depicted as having a collector terminal (C), a base terminal B, and a pair off emitter terminals (E1 and E2). A DC bias and filtering network 814 is connected to the collector terminal. A dual mode coupled resonator 818 is coupled across the emitter terminals through a filtering and tuning voltage network 822. A higher order mode suppression network 826 and a dynamically tuned filter and matching network 830 are coupled between the collector terminal and the filtering and tuning voltage network 822. A hybrid mode negative resistance generating network 836 is coupled across the base and collector terminals of the active device 810.

Figure 9A:
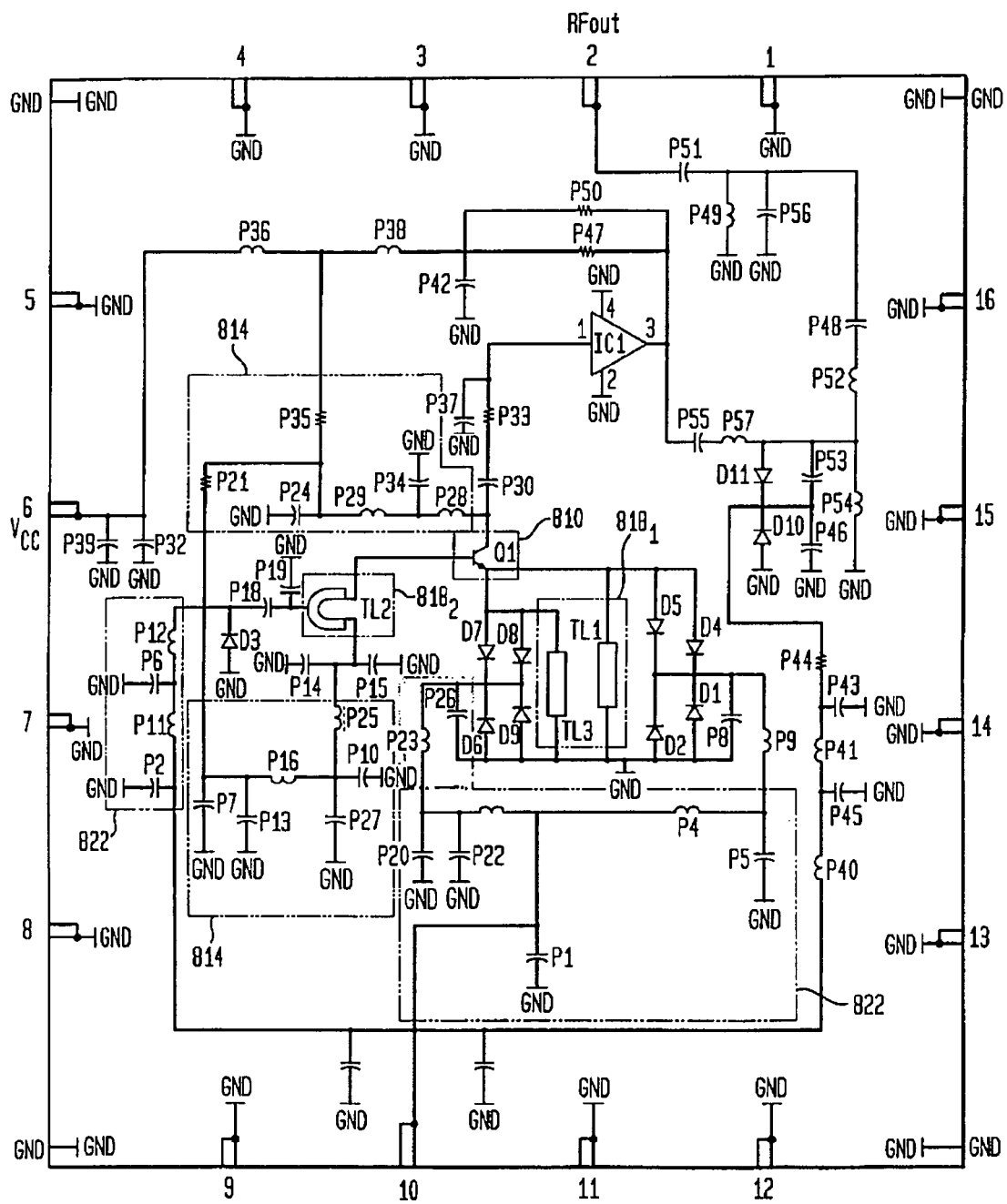
FIG. 9A illustratively depicts a schematic circuit diagram of a voltage controlled oscillator implemented accordance with an aspect of the present invention.
Figure 9B:
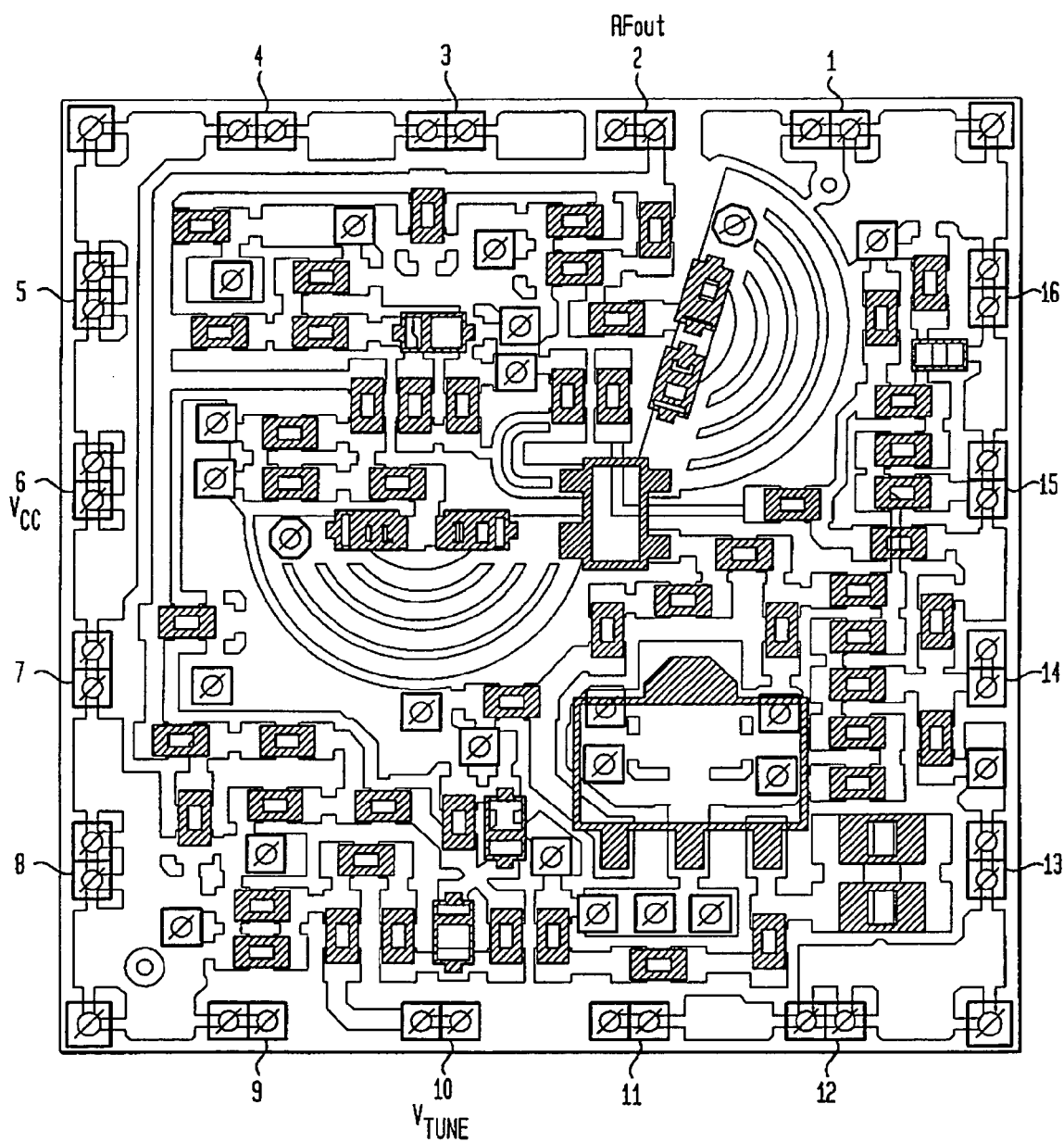
FIG. 9B illustratively depicts a printed circuit board layout diagram of a voltage controlled oscillator implemented in accordance with an aspect of the present invention.

FIGS. 9A and 9B respectively illustrate a circuit schematic and PCB layout diagram of a VCO (2000-6000 MHz) 900 constructed in accordance with an aspect of the present invention. The measured phase noise of this oscillator is typically better than −110 dBc/Hz @100 kHz offset from the carrier frequency over the band (2000-6000 MHz). As shown in FIGS. 9A and 9B, the functional blocks shown in FIG. 8 may be implemented on a printed circuit board using discrete elements. In particular, the DC bias and filtering network 814 comprise the elements shown in the block 814 in FIG. 9A. The active device 810 is shown as transistor Q1 configured in parallel emitter mode. In particular, the dual mode coupled resonators $818_1$ are connected as shown in FIG. 9A. Though in FIG. 9A, the block 818₁ is shown as including only the transmission lines TL1 and TL3, it should be noted that each of these transmission lines are coupled in parallel to respective tuning diode networks. In particular, the tuning diode network associated with the line TL1 comprises diodes D1 through D5 along with the compassitor P8. A similar network is also associated with the transmission line TL3 as is shown in FIG. 9A.

The filtering and tuning voltage network 822 is also shown in FIG. 9A and comprises the discrete elements arranged as shown. The other dual mode coupled resonator 818₂ is shown as comprising the C-shaped transmission line TL2. As will be recognized by one skilled in the art, the other block identified in FIG. 8 may be discerned from the arrangement of the blocks identified in FIG. 9A.

FIG. 9B illustrates an integrated circuit implementing, the schematic circuit diagram shown in FIG. 9A.

Figure 10A:
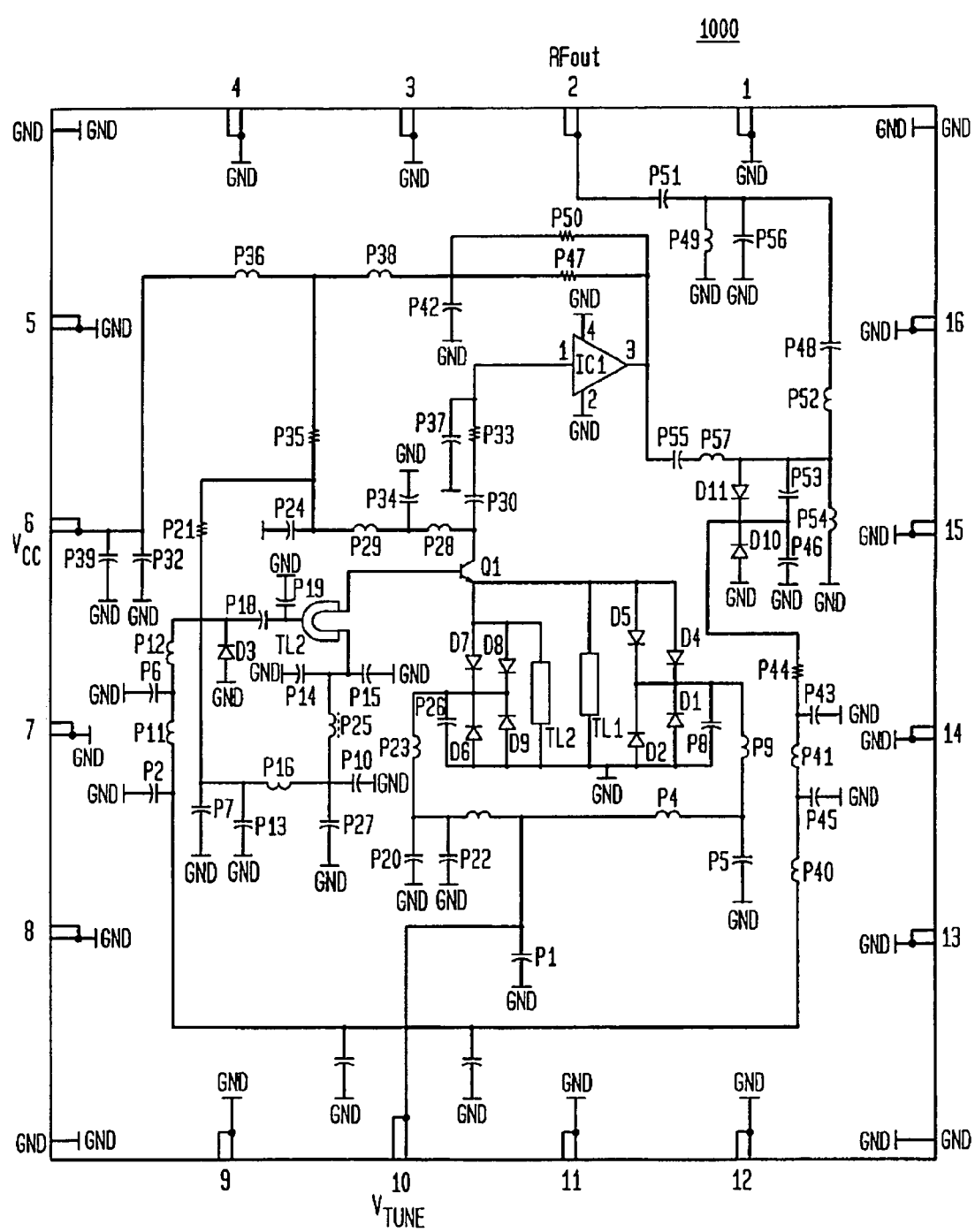
FIG. 10A illustratively depicts a schematic circuit diagram of a voltage controlled oscillator implemented in accordance with an aspect of the present invention.
Figure 10B:
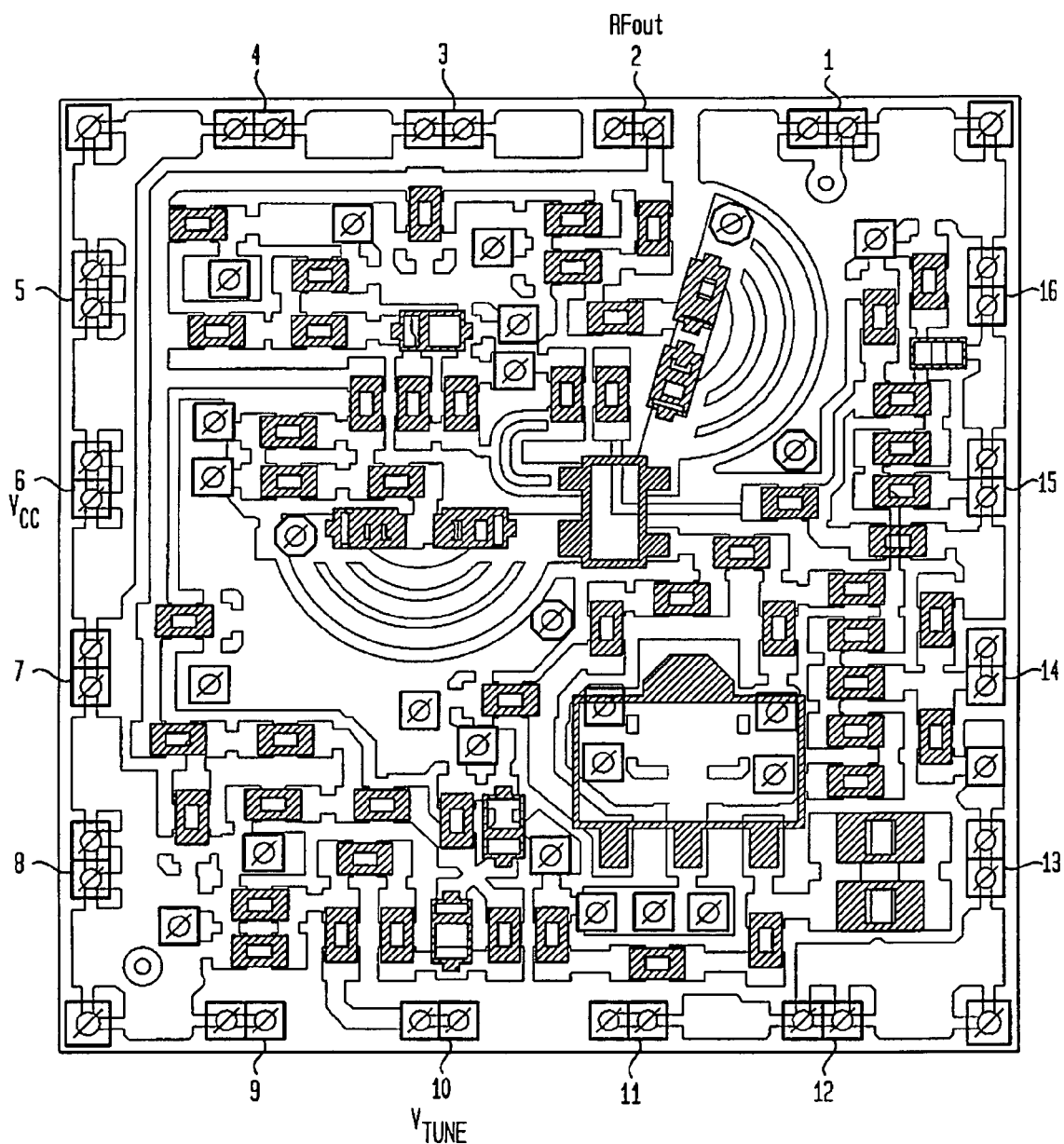
FIG. 10B illustratively depicts a printed circuit board layout diagram of a voltage controlled oscillator implemented in accordance with an aspect of the present invention.

FIGS. 10A and 10B respectively illustrate a circuit schematic and PCB layout diagram of a VCO 100 (1600-4800 MHz) constructed in accordance with an aspect of the present invention. The measured phase noise of this oscillator is typically better than −120 dBc/Hz @100 kHz offset from the carrier frequency over the band (1600-4800 MHz).

Figure 11A:
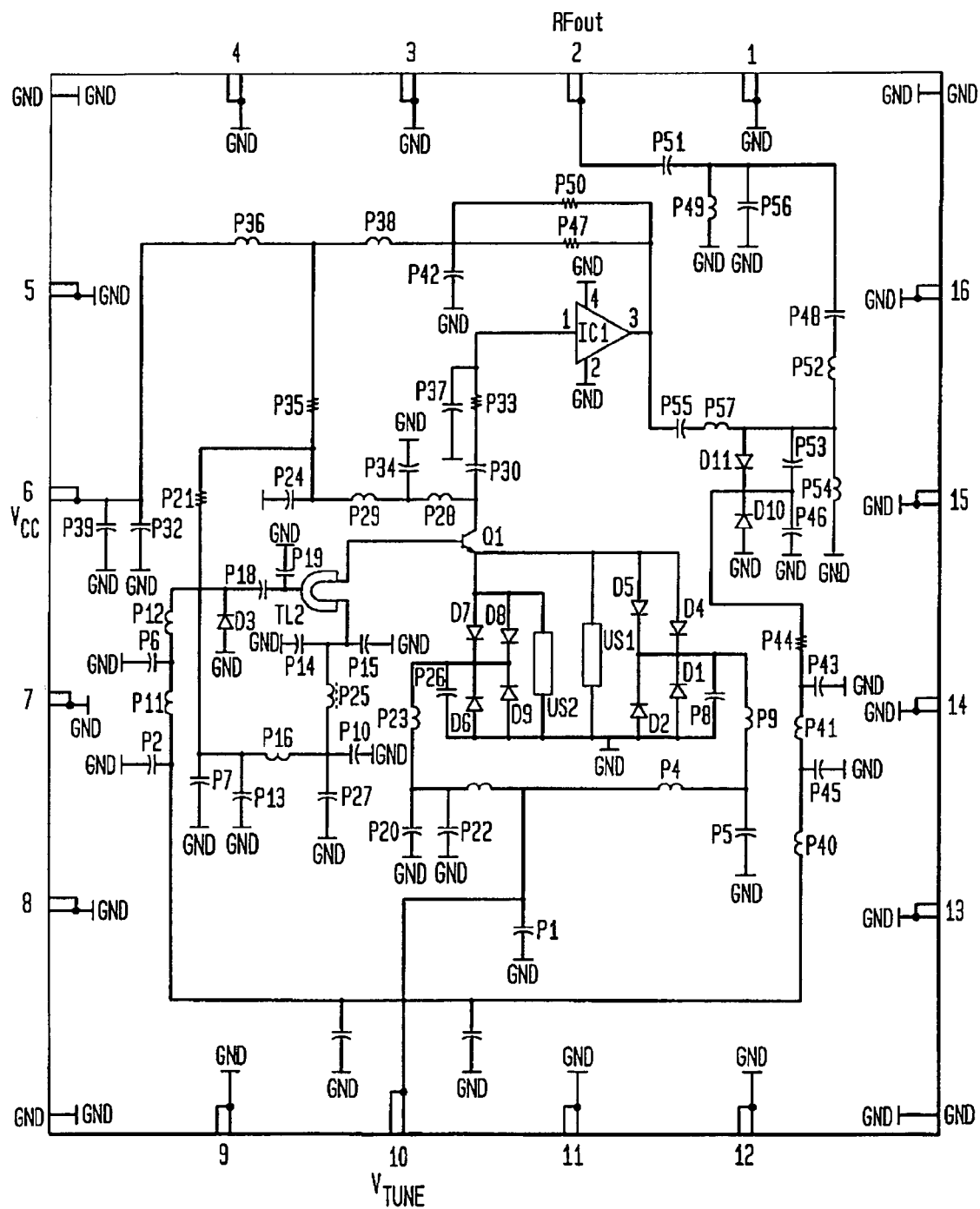
FIG. 11A illustratively depicts a schematic circuit diagram of a voltage controlled oscillator implemented in accordance with an aspect of the present invention.
Figure 11B:
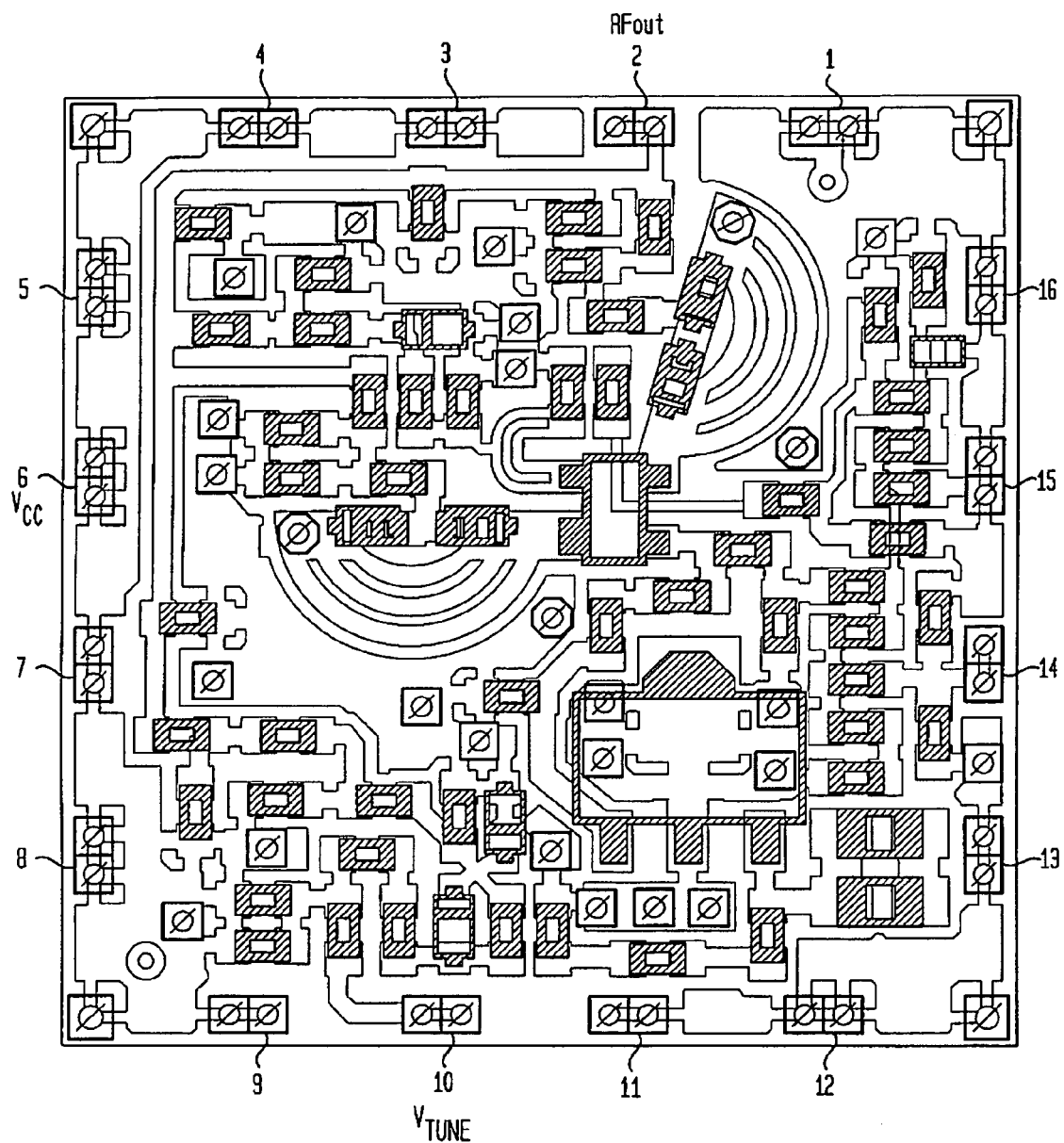
FIG. 11B illustratively depicts a printed circuit board layout diagram of a voltage controlled oscillator implemented in accordance with an aspect of the present invention.

FIGS. 11A and 11B respectively illustrate a circuit schematic and PCB layout diagram of the VCO (2400-7200 MHz) constructed in accordance with an aspect of the present invention. The measured phase noise of this oscillator is typically better than −115 dBc/Hz @100 kHz offset from the carrier frequency over the band (2400-7200 MHz).

Figure 12:
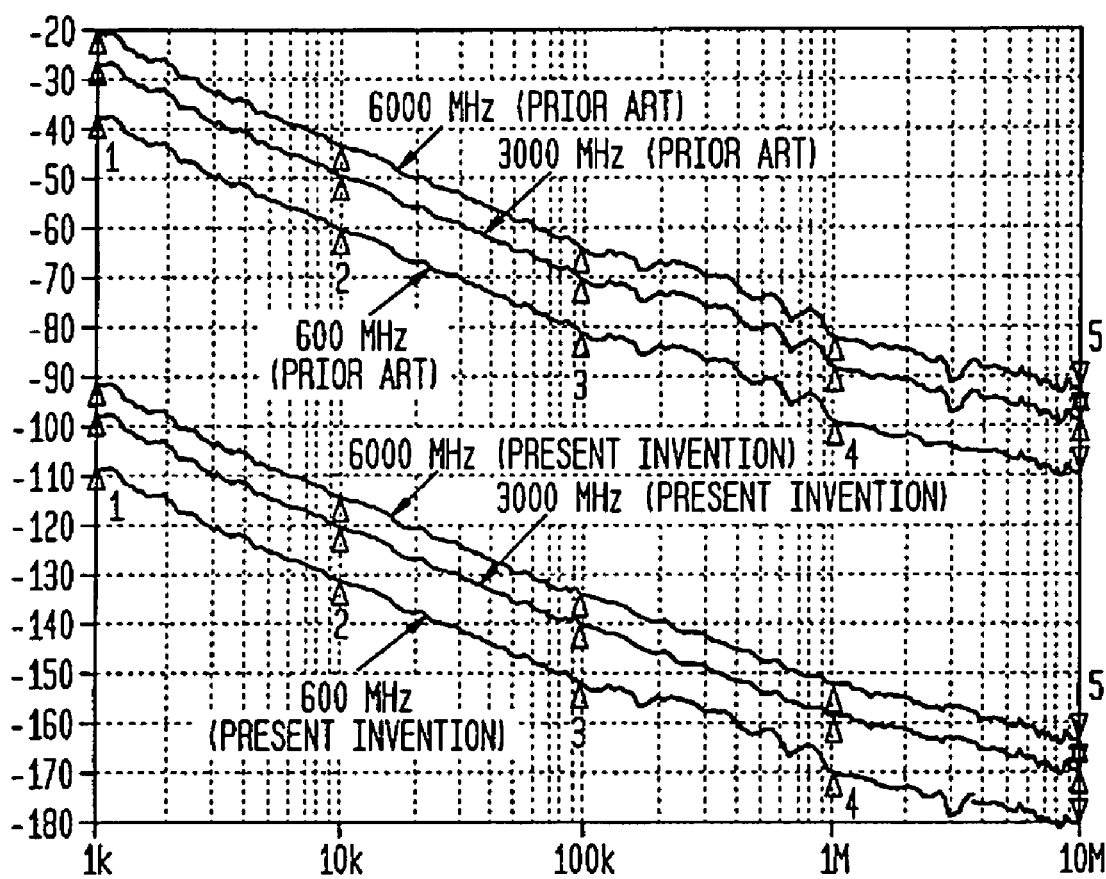
FIG. 12 illustratively depicts comparative phase plots of a prior art voltage controlled oscillator and a voltage controlled oscillator implemented in accordance with an aspect of the present invention.

FIG. 12 is a phase noise plot of a prior art VCO and a wideband VCO implemented in accordance with an aspect of the present invention. Both oscillators are tunable over a frequency band of 600-6000 MHz. However, as FIG. 12 shows, an oscillator implemented in accordance with the foregoing aspects of the present invention provides significant improvement in phase noise performance over the frequency band.

As discussed above, in accordance with a preferred embodiment, an EM (electromagnetic) coupled resonator is connected across the base and collector of a three terminal device through a coupling capacitor (as is shown for example in FIGS. 1, 2, 3, 4, 5, 6 and 7) that is electronically tuned by applying a tuning voltage to the tuning network integrated with the EM coupled resonator. An additional feature and advantage of this topology is the provision of a user definable frequency band by dynamically adjusting the effective RF coupling across the guided length of the planar coupled resonators for optimum loaded Q, thereby reducing noise performance over the tuning band. These and other advantages may be achieved by using one or more resonant circuit branches, which include two or more coupled resonator, with the tuning diode network incorporated across the coupled resonator circuit. An additional aspect of the present invention is an oscillator of the type in which the resonant load comprises an asymmetric coupled line disposed within a multilayer board. In accordance with this aspect of the present invention, group delay and phase hit performance are improved.

An arrangement of the VCO in which a half circled EM coupled resonator is placed between the collector and base terminals of the transistor (three terminal device) as illustrated for example in FIGS. 1, 2, 3, 4, 5, 6 and 7. Another arrangement of the VCO comprises placing a dual EM coupled resonator across the emitter and ground of the transistor (three terminal device) as illustrated for example in FIGS. 8, 9, 10, and 11. As seen for example in FIG. 9, tuning diodes are connected as variable capacitors across the inductive-coupled distributed line, thereby improving the loaded Q due to the virtue of the optimum coupling of the capacitive-coupled resonator. This supports the steep-phase characteristics at resonance frequency. The present invention deals with the design, fabrication, and testing of the multi-octave-band voltage controlled oscillator which can satisfy the needs for present demand for low-noise, tuning-range, harmonic-content, manufacturing-tolerance and miniaturization.

As is also seen in FIG. 9, a microstripline/stripline coupled-resonator may be used in a VCO (voltage controlled oscillator) implemented in accordance with another aspect of the present invention.

Another aspect of the present invention is its broad applicability. In particular, the approach can be used with any 3-terminal active device (bipolar, MOS, GaAs), and can be easily extended for coupled oscillator systems and parameters such as phase noise, thereby optimizing output power over a wide range of operating conditions.

Typically, the phase noise of the conventional microstripline resonator based wideband oscillator is 80 dBc/Hz @10 KHz for a frequency band of 30-1200 MHz. Such oscillators typically operate at 12V, 25 mA. In accordance with the various aspects of the present invention, a cost effective and power efficient solution (5V, 15 mA) may be realized by dynamically tuning the phase of the negative resistance generating device, dynamically probing the output from the resonator, dynamically RF coupling along the guided structure of the planar coupled resonator, and dynamically filtering the noise over the multi-octave-band. Furthermore, incorporating dynamically parallel and series tuned networks along the guided structure of the coupled resonator improves the phase noise over the band.

The present invention also advantageously allows for a reduction in the number of the components, such as inductors and capacitors, and may be integrated in chip form as is shown in the foregoing drawings.

A voltage-controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

Although the invention herein has been described with reference to particular embodiments, it is to be understood that these embodiments are merely illustrative of the principles and applications of the present invention. The accompanying drawings, which are incorporated in and form a part of this description, illustrates various aspects of the present invention. The present invention may be embodied in other specific forms without departing from the spirit or essential characteristics thereof. The presently disclosed embodiments are therefore considered in all respects to be illustrative and not restrictive. It is therefore to be understood that numerous modifications may be made to the illustrative embodiments and that other arrangements may be devised without departing from the spirit and scope of the present invention as defined by the appended claims.

The invention claimed is:

1. An oscillator operable at an oscillating frequency, comprising:

a transistor having base, emitter and collector terminals;

a multi-mode coupled resonator coupled across the base and collector terminals through a dynamically tunable capacitive element; and a slow-wave coupled resonator and a progressive-wave coupled resonator coupled in series to the collector terminal.

2. The oscillator of claim 1, further comprising a noise filtering network coupled across the base and collector terminals.

3. The oscillator of claim 1, further comprising a noise cancellation network coupled across the base and collector terminals.

4. The oscillator of claim 1, further comprising a noise feedback and bias network coupled across the base and collector terminals.

5. The oscillator of claim 1, further comprising a phase compensating network capacitively coupled between the base and collector terminals through the slow-wave and progressive-wave coupled resonators.

6. The oscillator of claim 1, further comprising a distributed coupled medium coupled between the slow-wave and progressive-wave coupled resonators.

7. The oscillator of claim 1, wherein the multimode resonator comprises an electromagnetically coupled resonator.

8. The oscillator of claim 7, wherein the electromagnetically coupled resonator comprise at least two planar coupled resonators.

9. The oscillator of claim 8, wherein the effective coupling across the planar coupled resonators may be dynamically adjusted to provide a user selectable frequency band.

10. The oscillator of claim 1, further comprising a tuning network coupled to the multi-mode coupled resonator, the tuning network being operable to tune the oscillation frequency.

11. The oscillator of claim 1, wherein the oscillator is implemented on a printed circuit board.

12. A communication device, comprising:

a module for transmitting information; and a multi-octave band tunable oscillator coupled to the module, the tunable oscillator comprising, a bipolar transistor having base, collector and emitter terminals;

a plurality of planar resonators electromagnetically coupled to each other and to the transistor;

an active bias network coupled to the transistor and operable to provide a substantially constant bias voltage to the transistor;

wherein the plurality of resonators include a multi-mode coupled resonator coupled across the base and collector terminals of the transistor through a dynamically tunable capacitive element, and include a slow-wave coupled resonator and a progressive-wave coupled resonator coupled in series to the collector terminal.

13. The communication device of claim 12, wherein the communication device is selected from the group consisting of a frequency synthesizer, spectrum analyzer, telephone, personal digital assistant, desktop computer and laptop.

* * * * *